(12) United States Patent
Akita et al.

(10) Patent No.: US 9,159,853 B2
(45) Date of Patent: Oct. 13, 2015

(54) GROUP III-V COMPOUND SEMICONDUCTOR PHOTO DETECTOR, METHOD OF FABRICATING GROUP III-V COMPOUND SEMICONDUCTOR PHOTO DETECTOR, PHOTO DETECTOR, AND EPITAXIAL WAFER

(71) Applicant: Sumitomo Electric Industries, Ltd., Osaka-shi (JP)

(72) Inventors: Katsushi Akita, Itami (JP); Takashi Ishizuka, Itami (JP); Kei Fujii, Itami (JP); Youichi Nagai, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 2 days.

(21) Appl. No.: 14/072,636

(22) Filed: Nov. 5, 2013

(65) Prior Publication Data
US 2014/0061588 A1    Mar. 6, 2014

Related U.S. Application Data

(62) Division of application No. 13/394,650, filed as application No. PCT/JP2010/062228 on Jul. 21, 2010, now Pat. No. 8,866,199.

(30) Foreign Application Priority Data

Sep. 7, 2009  (JP) ................................ 2009-206288
Sep. 7, 2009  (JP) ................................ 2009-206310

(51) Int. Cl.
*H01L 31/00*   (2006.01)
*H01L 27/148*  (2006.01)
(Continued)

(52) U.S. Cl.
CPC .. *H01L 31/035209* (2013.01); *H01L 21/02392* (2013.01); *H01L 21/02458* (2013.01);
(Continued)

(58) Field of Classification Search
CPC .............. H01L 31/0262; H01L 31/10; H01L 31/035236; Y02E 10/544
USPC .......................................... 257/21; 438/478
See application file for complete search history.

(56) References Cited

U.S. PATENT DOCUMENTS

2001/0035530 A1   11/2001   Udagawa
2002/0008249 A1   1/2002    Minetani
(Continued)

FOREIGN PATENT DOCUMENTS

JP        63-1079 A    1/1988
JP        S63955 B2    1/1988
(Continued)

OTHER PUBLICATIONS

Sidhu et al_A long-wavelength photodiode on InP using lattice-matched GaInAs—GaAsSb type-II quantum wells—Photonics Technology Letterss IEEE vol. 17 No. 12 pp. 2715-2717 Dec. 2005.*
(Continued)

*Primary Examiner* — Chuong A Luu
*Assistant Examiner* — Moazzam Hossain
(74) *Attorney, Agent, or Firm* — Venable LLP; Michael A. Sartori; F. Brock Riggs

(57) ABSTRACT

An object of the present invention is to provide a group III-V compound semiconductor photo detector comprising an absorption layer having a group III-V compound semiconductor layer containing Sb as a group V constituent element, and an n-type InP window layer, resulting in reduced dark current. The InP layer 23 grown on the absorption layer 23 contains antimony as impurity, due to the memory effect with antimony which is supplied during the growth of a GaAsSb layer of the absorption layer 21. In the group III-V compound semiconductor photo detector 11, the InP layer 23 contains antimony as impurity and is doped with silicon as n-type dopant. Although antimony impurities in the InP layer 23 generate holes, the silicon contained in the InP layer 23 compensates for the generated carriers. As a result, the second portion 23d of the InP layer 23 has sufficient n-type conductivity.

7 Claims, 13 Drawing Sheets

(51) Int. Cl.

| | |
|---|---|
| *H01L 31/0352* | (2006.01) |
| *H01L 21/02* | (2006.01) |
| *H01L 31/0304* | (2006.01) |
| *H01L 31/109* | (2006.01) |
| *H01L 31/18* | (2006.01) |

(52) U.S. Cl.
CPC .... *H01L21/02461* (2013.01); *H01L 21/02463* (2013.01); *H01L 21/02466* (2013.01); *H01L 21/02507* (2013.01); *H01L 21/02546* (2013.01); *H01L 31/03042* (2013.01); *H01L 31/03046* (2013.01); *H01L 31/035236* (2013.01); *H01L 31/109* (2013.01); *H01L 31/184* (2013.01); *Y02E 10/544* (2013.01)

(56) References Cited

U.S. PATENT DOCUMENTS

| | | |
|---|---|---|
| 2004/0119129 A1 | 6/2004 | Giboney |
| 2005/0045941 A1 | 3/2005 | Kurita et al. |
| 2006/0001118 A1 | 1/2006 | Boisvert et al. |
| 2007/0264835 A1 | 11/2007 | Iguchi et al. |
| 2009/0218594 A1 | 9/2009 | Ishimura et al. |
| 2010/0181484 A1 | 7/2010 | Inada et al. |
| 2010/0258894 A1* | 10/2010 | Inada .................. 257/443 |
| 2011/0037097 A1 | 2/2011 | Scott et al. |

FOREIGN PATENT DOCUMENTS

| | | |
|---|---|---|
| JP | 5-047692 A | 2/1993 |
| JP | 05-160426 | 6/1993 |
| JP | 05-206497 | 8/1993 |
| JP | 2002-083993 | 3/2002 |
| JP | 2005-260118 | 9/2005 |
| JP | 2006-270060 | 10/2006 |
| JP | 2007-080920 A | 3/2007 |
| JP | 2007-324572 A | 12/2007 |
| WO | WO-2009/014076 A1 | 1/2009 |

OTHER PUBLICATIONS

Sidhu et al., "A Long-Wavelength Photodiode on InP Using Lattice-Matched GaInAs—GaAsSb Type-II Quantum Wells," IEEE Photonics Technology Letters vol. 17, No. 12, pp. 2715-2717 (Dec. 2005).

Office Action issued in Japanese Patent Application No. 2009-206310 dated Jun. 18, 2013.

Notice of Reasons for Rejection in Japanese Patent Application No. 2011-044344, dated Sep. 24, 2013.

Office Action in U.S. Appl. No. 13/394,650, dated Dec. 19, 2013.

Office Action in U.S. Appl. No. 14/490,128, dated Jul. 9, 2015.

* cited by examiner

Fig.2
(a)
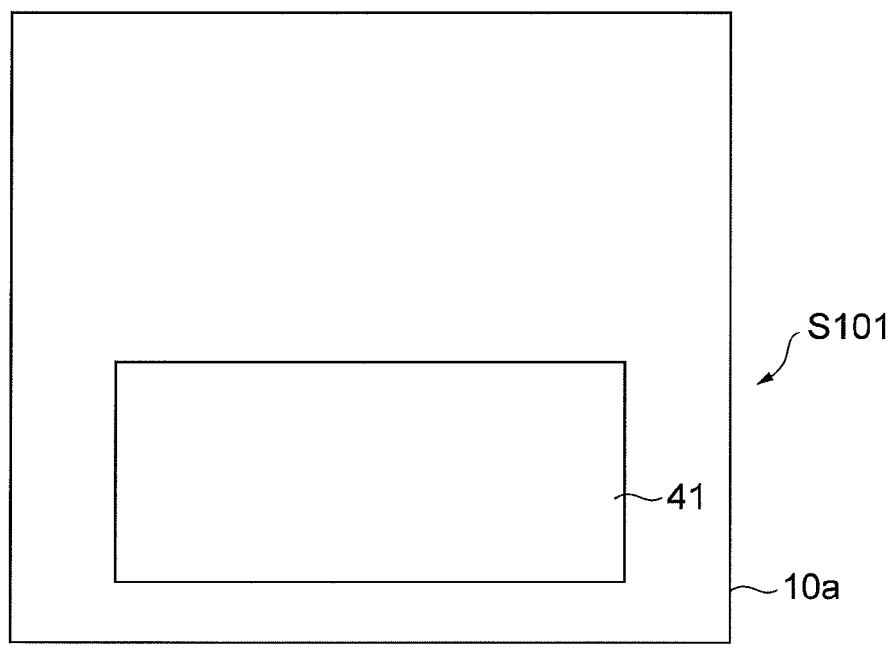
(b)
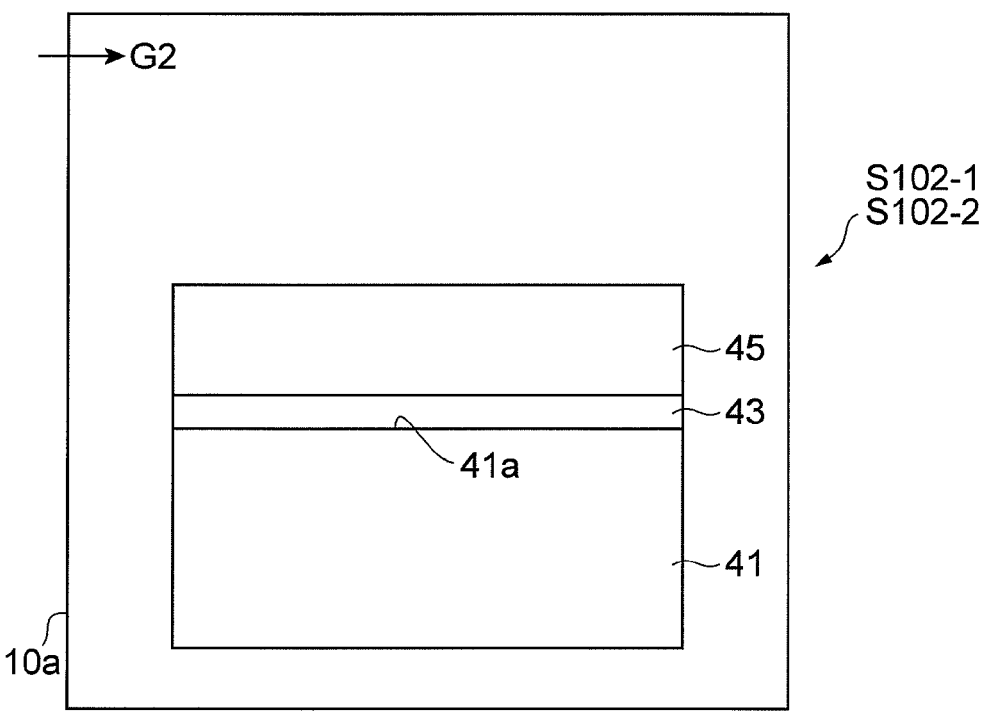

Fig.3
(a)
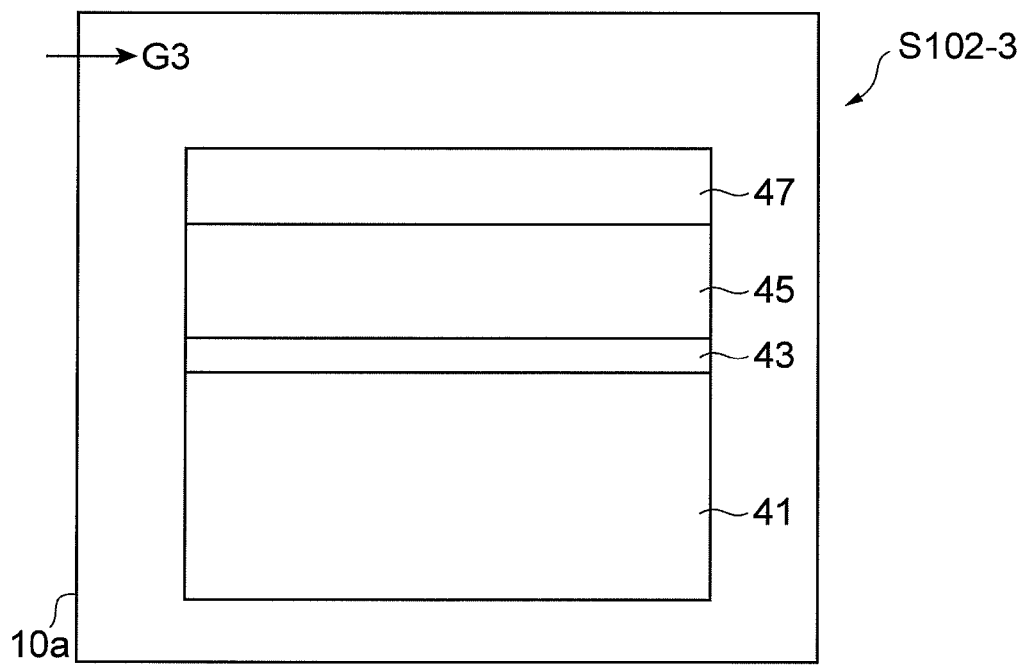
(b)
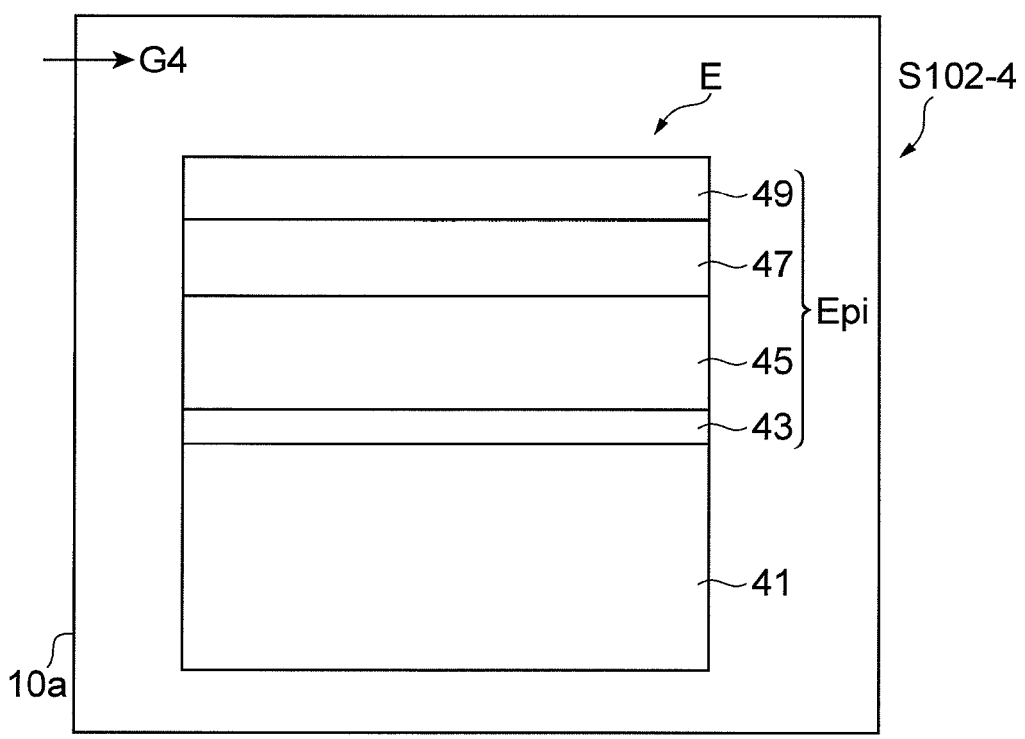

Fig.4
(a)
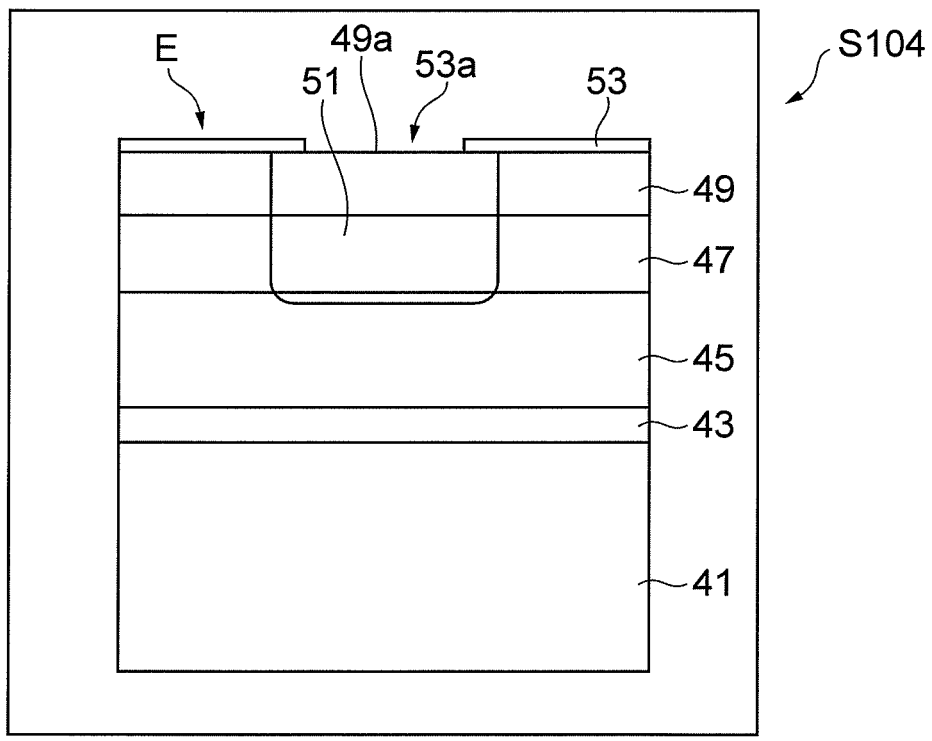
(b)
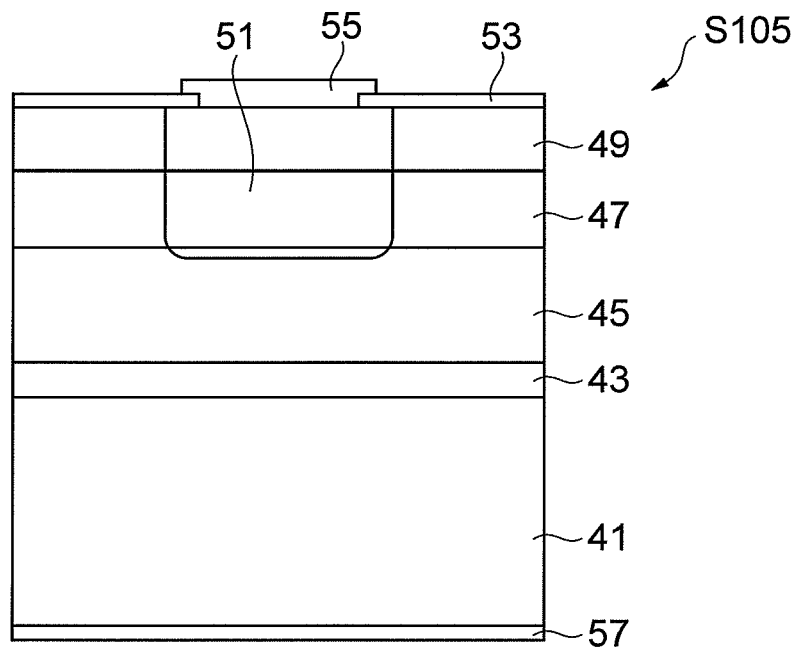

*Fig.6*

|  | Sb CONCENTRATION (cm$^{-3}$) | |
|---|---|---|
|  | STRUCTURE A | STRUCTURE B |
| InP WINDOW LAYER | $1 \times 10^{18}$ | $1 \times 10^{19}$ |
| SECOND InGaAs LAYER | BELOW DETECTION LIMIT BY SIMS LESS THAN $1 \times 10^{16}$(cm$^{-3}$) | BELOW DETECTION LIMIT BY SIMS LESS THAN $1 \times 10^{16}$(cm$^{-3}$) |

Fig.8

| | EXAMPLE A1 | EXAMPLE A2 | EXAMPLE A3 | EXAMPLE A4 | EXAMPLE A5 | EXAMPLE A6 | EXAMPLE A7 |
|---|---|---|---|---|---|---|---|
| Si CONCENTRATION IN InP WINDOW LAYER ($cm^{-3}$) | BELOW DETECTION LIMIT BY SIMS | $5 \times 10^{15}$ | $1.5 \times 10^{16}$ | $2 \times 10^{16}$ | $1 \times 10^{17}$ | $1 \times 10^{19}$ | $5 \times 10^{19}$ |
| CARRIER TYPE IN InP LAYER | p-TYPE | p-TYPE | n-TYPE | n-TYPE | n-TYPE | n-TYPE | n-TYPE |
| CONCENTRATION OF ELECTRON OR HOLE IN InP WINDOW LAYER ($cm^{-3}$) | $1 \times 10^{16}$ | $5 \times 10^{15}$ | $5 \times 10^{15}$ | $1 \times 10^{16}$ | $1 \times 10^{17}$ | $1 \times 10^{19}$ | $5 \times 10^{19}$ |
| DARK CURRENT IN LIGHT-RECEIVING LAYER, 100 μmφ Vf=5V | 20 μA UNDESIRABLE DUE TO DARK CURRENT | 20 μA UNDESIRABLE DUE TO DARK CURRENT | 10 μA UNDESIRABLE DUE TO DARK CURRENT | 2 μA SATISFACTORY PROPERTIES | 2 μA SATISFACTORY PROPERTIES | 2 μA SATISFACTORY PROPERTIES | 200 μA UNDESIRABLE DUE TO DARK CURRENT |

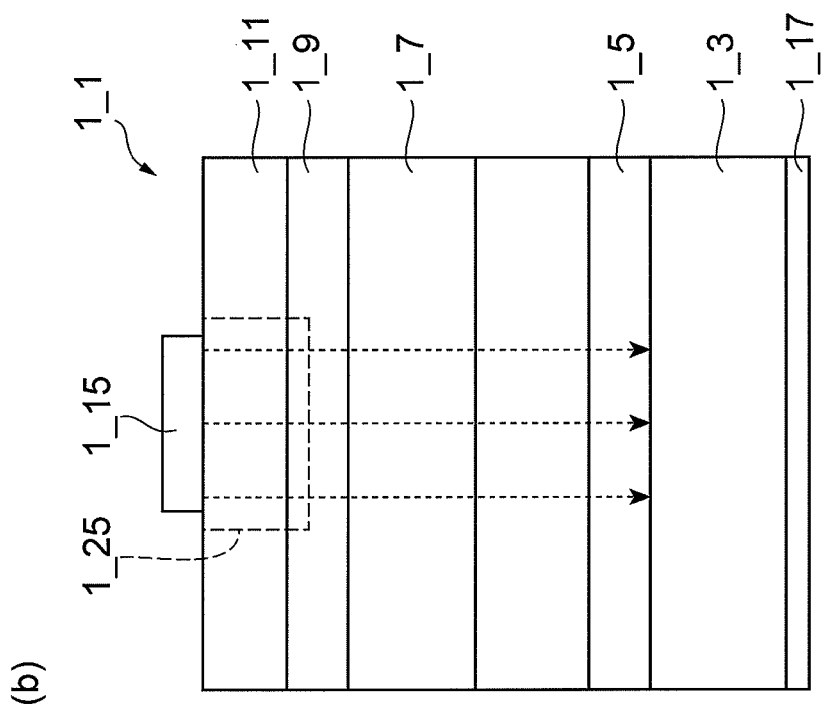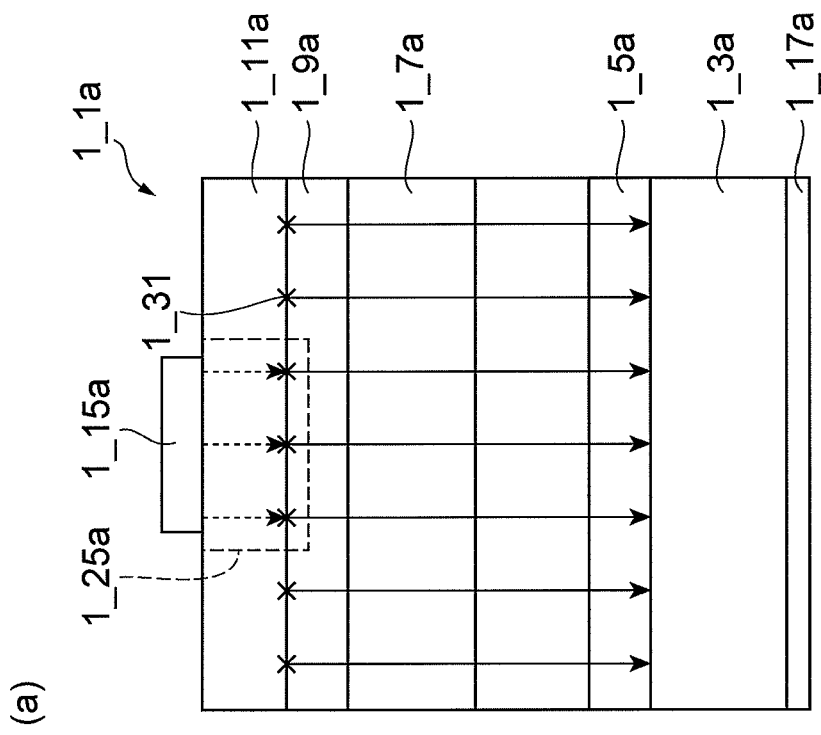
Fig. 10

Fig.12

| | EXAMPLE A8 | EXAMPLE A9 | EXAMPLE A10 | EXAMPLE A11 | COMPARATIVE EXAMPLE 1 | COMPARATIVE EXAMPLE 2 | COMPARATIVE EXAMPLE 3 |
|---|---|---|---|---|---|---|---|
| MAXIMUM CONCENTRATION OF CARRIER IN WINDOW LAYER EXCLUDING REGION EXTENDING TO DEPTH OF 0.1 μm FROM BINDING SURFACE BETWEEN WINDOW LAYER AND DIFFUSIVE-CONCENTRATION DISTRIBUTION-ADJUSTING LAYER (cm⁻³) | $1 \times 10^{16}$ | $1 \times 10^{16}$ | $3 \times 10^{15}$ | $2 \times 10^{17}$ | $1 \times 10^{16}$ | $1 \times 10^{16}$ | $3 \times 10^{15}$ |
| MAXIMUM CONCENTRATION OF CARRIER IN REGION EXTENDING TO DEPTH OF 0.1 μm AT BOTH SIDES OF BINDING SURFACE BETWEEN WINDOW LAYER AND DIFFUSIVE-CONCENTRATION LAYER (cm⁻³) | $2 \times 10^{17}$ | $8 \times 10^{18}$ | $6 \times 10^{15}$ | $2 \times 10^{17}$ | $8 \times 10^{15}$ | $2 \times 10^{19}$ | $3 \times 10^{15}$ |
| MAXIMUM CONCENTRATION OF CARRIER IN DIFFUSIVE-CONCENTRATION DISTRIBUTION-ADJUSTING LAYER EXCLUDING REGION EXTENDING TO DEPTH OF 0.1 μm FROM BINDING SURFACE BETWEEN WINDOW LAYER AND DIFFUSIVE-CONCENTRATION DISTRIBUTION-ADJUSTING LAYER (cm⁻³) | $3 \times 10^{15}$ | $3 \times 10^{15}$ | $3 \times 10^{15}$ | $3 \times 10^{15}$ | $3 \times 10^{15}$ | $3 \times 10^{15}$ | $3 \times 10^{15}$ |
| DARK CURRENT FOR −5 V (nA) (CORRESPONDING TO VALUE FOR LIGHT ENTRANCE DIAMETER OF 15 μmφ) | 4.3 | 5.4 | 5.8 | 6.3 | 11000 | 58 | 1500 |

Fig.13

| | EXAMPLE A8 | EXAMPLE A9 | EXAMPLE A10 | EXAMPLE A11 | COMPARATIVE EXAMPLE 1 | COMPARATIVE EXAMPLE 2 | COMPARATIVE EXAMPLE 3 |
|---|---|---|---|---|---|---|---|
| MAXIMUM CONCENTRATION OF DONOR IN WINDOW LAYER EXCLUDING REGION EXTENDING TO DEPTH OF 0.1 μm FROM BINDING SURFACE BETWEEN WINDOW LAYER AND DIFFUSIVE-CONCENTRATION DISTRIBUTION-ADJUSTING LAYER (cm$^{-3}$) | $1 \times 10^{16}$ | $1 \times 10^{16}$ | BELOW DETECTION LIMIT | $2 \times 10^{17}$ | $1 \times 10^{16}$ | $1 \times 10^{16}$ | BELOW DETECTION LIMIT |
| MAXIMUM CONCENTRATION OF DONOR IN REGION EXTENDING TO DEPTH OF 0.1 μm AT BOTH SIDE OF BINDING SURFACE BETWEEN WINDOW LAYER AND DIFFUSIVE-CONCENTRATION LAYER (cm$^{-3}$) | $2 \times 10^{17}$ | $8 \times 10^{18}$ | $6 \times 10^{15}$ | $2 \times 10^{17}$ | $8 \times 10^{15}$ | $2 \times 10^{19}$ | BELOW DETECTION LIMIT |
| MAXIMUM CONCENTRATION OF DONOR IN DIFFUSIVE-CONCENTRATION DISTRIBUTION-ADJUSTING LAYER EXCLUDING REGION EXTENDING TO DEPTH OF 0.1 μm FROM BINDING SURFACE BETWEEN WINDOW LAYER AND DIFFUSIVE-CONCENTRATION DISTRIBUTION-ADJUSTING LAYER (cm$^{-3}$) | BELOW DETECTION LIMIT | BELOW DETECTION LIMIT | BELOW DETECTION LIMIT | BELOW DETECTION LIMIT | BELOW DETECTION LIMIT | BELOW DETECTION LIMIT | BELOW DETECTION LIMIT |
| DARK CURRENT FOR -5 V (nA) (CORRESPONDING TO VALUE FOR LIGHT ENTRANCE DIAMETER OF 15 μmφ) | 4.3 | 5.4 | 5.8 | 6.3 | 11000 | 58 | 1500 |

GROUP III-V COMPOUND SEMICONDUCTOR PHOTO DETECTOR, METHOD OF FABRICATING GROUP III-V COMPOUND SEMICONDUCTOR PHOTO DETECTOR, PHOTO DETECTOR, AND EPITAXIAL WAFER

CROSS-REFERENCE TO RELATED APPLICATIONS

This application is a Divisional of U.S. Patent Application No. 13/394,650, filed Mar. 7, 2012, which is a National Stage of PCT International Application No. PCT/JP2010/062228, filed Jul.21, 2010, which claims the benefit of Japan Patent Application No. 2009-206288 and Japanese Patent Application No. 2009-206310, filed Sept.7, 2009, all of which are incorporated herein by reference in their entirety.

TECHNICAL FIELD

The present invention relates to a group III-V compound semiconductor photo detector, a method of fabricating a group III-V compound semiconductor photo detector, a photo detector, and an epitaxial wafer.

BACKGROUND ART

A method of fabricating a photodiode having a cutoff wavelength of 2.39 μm is shown in Non-patent Literature 1. A photo detector has an absorption layer disposed on an InP substrate, and a p-type InGaAs window layer. The absorption layer has a type-II quantum well structure of InGaAs/GaAsSb. After mesa etching, a $SiO_2$ passivation layer is formed on the p-type InGaAs window layer.

CITATION LIST

Non Patent Literature

Non-patent Literature 1: R. Sidhu, "Long-wavelength Photodiode on InP Using Lattice-Matched GaInAs—GaAsSb Type-II Quantum Wells" IEEE Photonics Technology Letters, Vol. 17, No. 12 (2005), pp. 2715-2717

SUMMARY OF INVENTION

Technical Problem

According to the knowledge of the inventors, use of an InGaAs window layer increases dark current, compared with use of an InP window layer. Hence, in an epitaxial layer structure for a photo detector having an absorption layer on an InP substrate, an InP window layer is used as an uppermost layer of the layer structure. In a front-surface-incident-type photodiode having an epitaxial layer used as an incident surface, an InP window layer does not absorb near-infrared light to reach an absorption layer. As described above, the InP window layer is also useful for reducing dark current.

In the photodiode, an epitaxial layer stack is grown by metal-organic vapor phase epitaxy. The epitaxial layer stack includes an absorption layer. If the absorption layer is constituted by group III-V compound semiconductor containing Sb as a group V constituent element, for example, an InGaAs/GaAsSb type-II quantum well structure, the epitaxial layer stack is formed by growing a group III-V compound semiconductor layer containing Sb as a group V constituent element and then growing a crystallized InP window layer. Subsequently, a p-n junction is formed by selectively forming an anode region on a portion of the epitaxial layer stack.

During the measurement of various characteristics of the photodiode prepared by this method, the inventors find an unexpected electrical behavior (an increase in dark current). According to a further investigation on the unexpected behavior, the InP window layer, which normally has n-type conductivity, indicates p-type conductivity. If the InP window layer has p-type conductivity, a p-n junction is formed outside the selectively formed anode region. This leads to expansion of the p-n junction region, and an increase in surface leak current due to surface exposure of the p-n junction region, resulting in a disadvantage of an increase in dark current. The inventors found the following event during an investigation on the cause of this phenomenon. For example, the inventors found that antimony as impurity in an amount exceeding the background level is contained in the InP, although antimony is not supplied during the growth of the InP window layer. According to study by the inventors, the contamination of antimony is characteristic to InP.

An object of the present invention, accomplished under such a circumstance, is to provide a group III-V compound semiconductor photo detector including an absorption layer and an n-type InP window layer and generating reduced dark current in which the absorption layer includes a group III-V compound semiconductor layer containing Sb as a group V constituent element, and a method of fabricating the same. Another object of the present invention is to provide a photo detector generating reduced dark current and an epitaxial wafer.

Solution to Problem

According to one aspect of the present invention, a group III-V compound semiconductor photo detector comprises (a) a semiconductor substrate having a principal surface; (b) an absorption layer being disposed on the principal surface of the semiconductor substrate; (c) an InP layer being disposed on the absorption layer and having a first portion and a second portion; and (d) an anode region of p-type semiconductor extending from a surface of the first portion of the InP layer toward the absorption layer. The bandgap energy of the absorption layer is smaller than the bandgap energy of InP. The InP layer is doped with n-type dopant. The majority carrier in the second portion of the InP layer is electron. The concentration of electron in the second portion of the InP layer is not less than $1 \times 10^{16}$ $cm^{-3}$.

In the group III-V compound semiconductor photo detector, the InP layer grown on the absorption layer contains antimony as impurity, which is derived from remaining antimony in a reactor after the growth of a group III-V compound semiconductor layer of the absorption layer under supply of antimony (i.e., the memory effect). According to an investigation by the inventors, antimony as impurity in the InP layer generates holes. The n-type dopant contained in the InP layer compensates for the generated carrier, so that the majority carrier in the second portion of the InP layer is electron. Since the electron concentration is not less than $1 \times 10^{16}$ $cm^{-3}$, the second portion of the InP layer has sufficient n-type conductivity. Thus, regions outside the selectively formed anode region have n-type conductivity, resulting in selective formation of a p-n junction, and thus reducing dark current.

According to one aspect of the present invention, a group III-V compound semiconductor photo detector comprises (a) a semiconductor substrate having a principal surface; (b) an absorption layer being disposed on the principal surface of the semiconductor substrate; and (c) an InP layer being disposed on the absorption layer. The bandgap energy of the absorption layer is smaller than the bandgap energy of InP. The InP layer is doped with donor. The concentration of donor in the InP layer is not less than $1\times10^{16}$ cm$^{-3}$.

In the group III-V compound semiconductor photo detector, the InP layer grown on the absorption layer contains antimony as impurity, which is derived from remaining antimony in a reactor after the growth of a group III-V compound semiconductor layer of the absorption layer under supply of antimony (i.e., the memory effect). According to an investigation by the inventors, the antimony as impurity in the InP layer generates holes. The donor contained in the InP layer compensates for the generated carriers, so that the majority carrier in the second portion of the InP layer is electron. Since the concentration of donor is not less than $1\times10^{16}$ cm$^{-3}$, the second portion of the InP layer has sufficient n-type conductivity. Thus, regions outside the selectively formed anode region have n-type conductivity, resulting in selective formation of a p-n junction, and thus reducing dark current.

In the group III-V compound semiconductor photo detector, the concentration of donor in the InP layer may be not more than $1\times10^{19}$ cm$^{-3}$. In the group III-V compound semiconductor photo detector, the donor in the InP layer may be silicon.

In the group III-V compound semiconductor photo detector, the absorption layer may have a group III-V compound semiconductor layer containing at least antimony as a group V element. In the group III-V compound semiconductor photo detector, the InP layer may contain antimony as impurity.

In the group III-V compound semiconductor photo detector, the concentration of electron in the second portion of the InP layer may be not more than $1\times10^{19}$ cm$^{-3}$.

In the group III-V compound semiconductor photo detector, if the second portion of the InP layer has an electron concentration of not more than $1\times10^{19}$ cm$^{-3}$, the anode region can have proper properties.

In the group III-V compound semiconductor photo detector, the antimony concentration in the InP layer may be not less than $1\times10^{17}$ cm$^{-3}$ and not more than $1\times10^{19}$ cm$^{-3}$.

In the group III-V compound semiconductor photo detector, the concentration of antimony as impurity in the InP layer is within the above range, in which part of the antimony impurities generate holes. Dopant silicon compensates for the generated hole carriers, resulting in making electron the majority carrier. Thus, regions outside the selectively formed anode region have n-type conductivity, resulting in selective formation of a p-n junction, and thus reducing dark current.

The group III-V compound semiconductor photo detector may further comprise an undoped InGaAs layer disposed between the absorption layer and the InP layer. The antimony concentration in the InP layer is higher than the antimony concentration in the InGaAs layer.

In the group III-V compound semiconductor photo detector, the InGaAs layer can be used to adjust a position of the anode region relative to the absorption layer. Although the InGaAs layer contains antimony as impurity, the concentration of antimony in the InP layer is higher than the concentration of antimony in the InGaAs layer. Thus, the InGaAs layer can be undoped.

The group III-V compound semiconductor photo detector may further comprise a passivation layer of insulating material. The passivation layer covers a surface of the second portion of the InP layer.

The group III-V compound semiconductor photo detector can reduce surface leak current, as well as dark current caused by a window layer material.

In the group III-V compound semiconductor photo detector, the absorption layer may have at least one structure of a multiple quantum well structure having an InGaAs layer and a GaAsSb layer, and a multiple quantum well structure having a GaInNAs layer and a GaAsSb layer. The absorption layer may include a GaAsSb layer.

In the group III-V compound semiconductor photo detector, an absorption layer having desired wavelength sensitivity can be obtained.

In the group III-V compound semiconductor photo detector, the semiconductor substrate is constituted by conductive InP. The group III-V compound semiconductor photo detector may further comprise a cathode electrode being disposed on a rear surface of the semiconductor substrate.

In the group III-V compound semiconductor photo detector, the InP substrate can provide an absorption layer having a preferred light-receiving sensitivity. Moreover, the anode region selectively provided on the first portion of the InP layer and the cathode provided on the InP substrate can provide a preferred light-receiving property, in which the anode region comprises p-type semiconductor extending from the surface to the absorption layer.

Another aspect of the present invention is to provide a method of fabricating a group III-V compound semiconductor photo detector. The method comprises the steps of: (a) disposing a substrate into a reactor; (b) preparing an epitaxial wafer in the reactor by growing a semiconductor layer stack for the group III-V compound semiconductor photo detector; (c) bringing out the epitaxial wafer from the reactor after forming an InP layer on an absorption layer; and (d) forming an anode region of p-type semiconductor extending toward the absorption layer by introducing p-type dopants from a surface of the InP layer, after bringing out the epitaxial wafer from the reactor. The step of growing the semiconductor layer stack includes (b1) a step of forming the absorption layer on a principal surface of the substrate by supplying a source gas containing antimony source and a group V source into the reactor, in which the absorption layer has a group III-V compound semiconductor layer containing at least antimony as a group V constituent element, (b2) a step of forming the InP layer with n-type conductivity on the absorption layer by supplying a source gas containing n-type dopant, indium source and phosphorus source into the reactor, after stopping the supply of the antimony source into the reactor. The bandgap energy of the absorption layer is smaller than the bandgap energy of InP. The InP layer contains antimony as impurity. The concentration of electron in the InP layer is not less than $1\times10^{16}$ cm$^{-3}$.

According to this method, although the InP layer is grown without supplying antimony into the reactor, the InP layer contains antimony as impurity, which is derived from remaining antimony in the reactor after the growth of the group III-V compound semiconductor layer of the absorption layer (i.e., the memory effect). According to an investigation by the inventors, the antimony as impurity in the InP layer generates holes. The n-type dopant doped in the InP layer compensates for the generated carriers, and thus the majority carrier in the second portion of the InP layer is electron. Since the concentration of electron is not less than $1\times10^{16}$ cm$^{-3}$, the second portion of the InP layer has sufficient n-type conductivity.

Another aspect of the present invention is to provide a method of fabricating a group III-V compound semiconductor photo detector. The method comprises the steps of: (a) disposing a substrate into a reactor; (b) preparing an epitaxial wafer by growing a semiconductor layer stack for the group III-V compound semiconductor photo detector, in the reactor; (c) bringing out the epitaxial wafer from the reactor after forming an InP layer on an absorption layer; and (d) forming an anode region of p-type semiconductor extending toward the absorption layer by introducing p-type dopants from a surface of the InP layer after bringing out the epitaxial wafer from the reactor. The step of growing the semiconductor layer stack includes (b1) a step of forming the absorption layer on a principal surface of the substrate, (b2) a step of forming the InP layer with n-type conductivity on the absorption layer by supplying a source gas containing n-type dopant, indium source and phosphorous source into the reactor. The bandgap energy of the absorption layer is smaller than the bandgap energy of InP. The concentration of donor in the InP layer is not less than $1 \times 10^{16}$ cm$^{-3}$.

According to the method, although the InP layer is grown without supplying antimony into the reactor, the InP layer contains antimony as impurity, which is derived from remaining antimony in the reactor after the growth of the group III-V compound semiconductor layer of the absorption layer under supply of antimony (i.e., a memory effect). According to an investigation by the inventors, the antimony as impurity in the InP layer generates holes. Since the donor in the InP layer compensates for the generated holes, the majority carrier in the second portion of the InP layer is electron. Since the concentration of donor is not less than $1 \times 10^{16}$ cm$^{-3}$, the second portion of the InP layer has sufficient n-type conductivity.

According to the method, the concentration of donor in the InP layer may be not more than $1 \times 10^{19}$ cm$^{-3}$. According to the method, the donor in the InP layer may be silicon.

The method further comprises a step of supplying a source gas containing antimony source and group V source into the reactor, and the absorption layer can have a group III-V compound semiconductor layer containing at least antimony as a group V element. According to the method, the InP layer may also contain antimony as impurity.

According to the method, the concentration of electron in the second portion of the InP layer may be not more than $1 \times 10^{19}$ cm$^{-3}$.

According to the method, if the concentration of electron in the InP layer is not more than $1 \times 10^{19}$ cm$^{-3}$, the anode region can have proper properties without an increase in p-type dopants to form the anode region.

According to the method, the antimony concentration in the InP layer may be not less than $1 \times 10^{17}$ cm$^{-3}$ and not more than $1 \times 10^{19}$ cm$^{-3}$.

According to the method, the concentration of antimony as impurity in the InP layer is within the above range, in which part of the antimony impurities generate holes.

The method may further comprise a step of growing an InGaAs layer on the absorption layer by supplying a source gas containing group III source and group V source into the reactor before growing the InP layer. The antimony concentration in the InGaAs layer is lower than the antimony concentration in the InP layer.

According to the method, the InGaAs layer may be used to adjust a position of the anode region relative to the absorption layer. Although the InGaAs layer also contains antimony as impurity, the concentration of antimony in the InP layer is higher than the concentration of antimony in the InGaAs layer. Thus, the InGaAs layer can remain undoped.

According to the method, the absorption layer may have at least one structure of a multiple quantum well structure having an InGaAs layer and a GaAsSb layer, and a multiple quantum well structure having a GaInNAs layer and a GaAsSb layer, and the absorption layer may include a GaAsSb layer.

The method can form an absorption layer having desired wavelength sensitivity.

According to the method, the absorption layer and the InP layer may be grown by metal-organic vapor phase epitaxy. According to this method, the memory effect due to remaining antimony occurs during the growth of the InP layer while the absorption layer and the InP layer can have proper properties.

According to another aspect of the present invention, a photo detector comprises a substrate of group III-V semiconductor; an absorption layer being provided on the substrate; a diffusive-concentration distribution-adjusting layer of group III-V semiconductor being provided in contact with the absorption layer; and a window layer of group III-V semiconductor being provided in contact with the diffusive-concentration distribution-adjusting layer and having a bandgap energy larger than the bandgap energy of the diffusive-concentration distribution-adjusting layer, the absorption layer being disposed between the diffusive-concentration distribution-adjusting layer and the substrate, the diffusive-concentration distribution-adjusting layer being disposed between the absorption layer and the window layer, a semiconductor region being constituted by the window layer and the diffusive-concentration distribution-adjusting layer and having a first region and a second region, the first region and the second region being disposed, in sequence, along a binding surface between the semiconductor region and the absorption layer, the first region containing a predetermined impurity element and being in contact with the second region, the first region having p-type conductivity, and a maximum value of a concentration of n-type carrier in a predetermined region being not less than $5 \times 10^{15}$ cm$^{-3}$ and not more than $1 \times 10^{19}$ cm$^{-3}$, the predetermined region extending from a binding surface between the window layer and the diffusive-concentration distribution-adjusting layer into the window layer or the diffusive-concentration distribution-adjusting layer in the second region.

For two adjacent pixels of photo detectors, if the concentration of carrier is less than $5 \times 10^{15}$ cm$^{-3}$ or more than $1 \times 10^{19}$ cm$^{-3}$, a preferred pnp junction cannot formed between the adjacent pixels. This leads to leak current between the adjacent pixels, resulting in increased dark current. Moreover, in the binding surface between the window layer and the diffusive-concentration distribution-adjusting layer (the interface between the diffusive-concentration distribution-adjusting layer and the window layer), a preferred pnp junction cannot be formed between the adjacent pixels due to generation of defects functioning as holes or carrier depletion caused by discontinuity of the bands. This leads to leak current in the adjacent pixels, resulting in increased dark current. In contrast, the photo detector according to the aspect of the present invention has an increased concentration of n-type carrier on the binding surface between the diffusive-concentration distribution-adjusting layer and the window layer, compared with the concentration of n-type carrier in the diffusive-concentration distribution-adjusting layer or the window layer, resulting in reduced dark current.

In the photo detector, the maximum value of the concentration of n-type carrier in the predetermined region may be higher than a maximum value of a concentration of n-type carrier in an outside region in contact with the predetermined region, the outside region lying in the window layer or the diffusive-concentration distribution-adjusting layer. Accordingly, the carrier concentration is increased only around the binding surface between the diffusive-concentration distribution-adjusting layer and the window layer, resulting in significantly reduced dark current.

According to another aspect of the present invention, a photo detector comprises a substrate of group III-V semiconductor; an absorption layer being provided on the substrate; a diffusive-concentration distribution-adjusting layer of group III-V semiconductor being provided in contact with the absorption layer; and a window layer of group III-V semiconductor being provided in contact with the diffusive-concentration distribution-adjusting layer and having a bandgap energy larger than the bandgap energy of the diffusive-concentration distribution-adjusting layer, the absorption layer being disposed between the diffusive-concentration distribution-adjusting layer and the substrate, the diffusive-concentration distribution-adjusting layer being disposed between the absorption layer and the window layer, a semiconductor region being constituted by the window layer and the diffusive-concentration distribution-adjusting layer and having a first region and a second region, the first region and the second region being disposed, in sequence, along a binding surface between the semiconductor region and the absorption layer, the first region containing a predetermined impurity element and being in contact with the second region, the first region having p-type conductivity, and a concentration of donor in a predetermined region being not less than $5 \times 10^{15}$ cm$^{-3}$ and not more than $1 \times 10^{19}$ cm$^{-3}$, the predetermined region extending from a binding surface between the window layer and the diffusive-concentration distribution-adjusting layer into the window layer or the diffusive-concentration distribution-adjusting layer.

For two adjacent pixels of photo detectors, if the concentration of carrier is less than $5 \times 10^{15}$ cm$^{-3}$ or more than $1 \times 10^{19}$ cm$^{-3}$, a preferred pnp junction cannot be formed between the adjacent pixels. This leads to leak current between the adjacent pixels, resulting in increased dark current. Moreover, in the binding surface between the diffusive-concentration distribution-adjusting layer and the window layer, a preferred pnp junction cannot be formed between the adjacent pixels due to generation of the defects functioning as holes or carrier depletion caused by discontinuity of the bands. This leads to leak current in the adjacent pixels, resulting in increased dark current. According to the aspect of the present invention, the photo detector has an increased concentration of n-type carrier on the binding surface between the window layer and the diffusive-concentration distribution-adjusting layer, compared with the concentration of n-type carrier in the diffusive-concentration distribution-adjusting layer and the window layer, resulting in reduced dark current. The concentration of carrier in such a range can be achieved by doping with donor impurities.

In the photo detector, the maximum value of the concentration of donor in the predetermined region may be higher than a maximum value of donor concentration in an outside region in contact with the predetermined region, the outside region lying in the window layer or the diffusive-concentration distribution-adjusting layer. Accordingly, the concentration of the donor is increased only around the binding surface between the diffusive-concentration distribution-adjusting layer and the window layer, resulting in significantly reduced dark current. Moreover, the thickness of the predetermined region may be not less than 0.02 µm and not more than 0.2 µm. The predetermined region having a thickness of less than 0.02 µm cannot compensate for the generation of the defects functioning as holes, or carrier depletion due to discontinuity of the bands, which cannot reduce dark current. The predetermined region having a thickness of more than 0.2 µm causes generation of excess n-type carriers, resulting in increased dark current.

In the photo detector, the donor may be Si. The use of Si facilitates the control of the concentration of n-type carrier or donor.

In the photo detector, the impurity element may be Zn. The dope with Zn as an impurity element provides a p-type region, so that an array of photo detectors can be formed on an epitaxial wafer.

In the photo detector, the diffusive-concentration distribution-adjusting layer may be constituted by InGaAs. Since Zn has a lower diffusion rate in InGaAs than in InP, the depth of diffused Zn can be more precisely controlled in InGaAs.

In the photo detector, the window layer may be constituted by InP. Since more technologies have been accumulated on the formation of a passivation layer on a surface of crystallized InP than on a surface of InGaAs, leakage of dark current can be readily controlled on the surface of InP. In a structure of the photo detector having a light entrance plane above the epitaxial layers, the window layer of InP effectively can reduce generation of dark current, preventing near-infrared absorption in the region from the light entrance plane to the absorption layer.

In the photo detector, the absorption layer may have a type-II multiple quantum well structure. Hence, the fabricated photo detector has light-receiving sensitivity over a longer wavelength range of the near-infrared (a wavelength>2 µm) region.

In the photo detector, the multiple quantum well structure may be constituted by a pair of an $In_xGa_{1-x}As$ ($0.38 \leq x \leq 0.68$) layer and a $GaAs_{1-y}Sb_y$ ($0.36 \leq y \leq 0.62$) layer, or, a pair of a $Ga_{1-t}In_tN_uAs_{1-u}$ ($0.4 \leq t \leq 0.8$, $0 < u \leq 0.2$) layer and a $GaAs_{1-v}Sb_v$ ($0.36 \leq v \leq 0.62$) layer. This enables efficient mass production of, for example, photodiodes having light-receiving sensitivity in the near-infrared region and high crystallinity.

According to another aspect of the present invention, an epitaxial wafer comprises a substrate of group III-V semiconductor; an absorption layer being provided on the substrate; a diffusive-concentration distribution-adjusting layer of group III-V semiconductor being provided in contact with the absorption layer; and a window layer of group III-V semiconductor being provided in contact with the diffusive-concentration distribution-adjusting layer and having a bandgap energy larger than the bandgap energy of the diffusive-concentration distribution-adjusting layer, the absorption layer being disposed between the diffusive-concentration distribution-adjusting layer and the substrate, the diffusive-concentration distribution-adjusting layer being disposed between the absorption layer and the window layer, a maximum value of a concentration of n-type carrier in a predetermined region being not less than $5 \times 10^{15}$ cm$^{-3}$ and not more than $1 \times 10^{19}$ cm$^{-3}$, the predetermined region extending from a binding surface between the window layer and the diffusive-concentration distribution-adjusting layer into the window layer or the diffusive-concentration distribution-adjusting layer.

For two adjacent pixels of photo detectors, if the concentration of carrier is less than $5 \times 10^{15}$ cm$^{-3}$ or more than $1 \times 10^{19}$ cm$^{-3}$, a preferred pnp junction cannot be formed between the adjacent pixels. This leads to leak current between the adjacent pixels, resulting in increased dark current. Moreover, in the binding surface between the diffusive-concentration distribution-adjusting layer and the window layer, a preferred pnp junction cannot be formed between the adjacent pixels due to generation of defects functioning as holes or carrier depletion caused by discontinuity of the bands. This leads to leak current in the adjacent pixels, resulting in increased dark current. In contrast, the epitaxial wafer according to the aspect of the present invention has an increased concentration of n-type carrier on the binding surface between the window layer and the diffusive-concentration distribution-adjusting layer, compared with the concentration of n-type carrier in the diffusive-concentration distribution-adjusting layer and the window layer, resulting in reduced dark current.

In the epitaxial wafer, the maximum value of the concentration of n-type carrier in the predetermined region of the window layer may be higher than a maximum value of a concentration of n-type carrier in an outside region in contact with the predetermined region, the outside region lying in the window layer or the diffusive-concentration distribution-adjusting layer. Accordingly, the concentration of the carrier is increased only around the binding surface between the diffusive-concentration distribution-adjusting layer and the window layer, resulting in significantly reduced dark current.

According to another aspect of the present invention, an epitaxial wafer comprises a substrate of group III-V semiconductor; an absorption layer being provided on the substrate; a diffusive-concentration distribution-adjusting layer of group III-V semiconductor being provided in contact with the absorption layer; and a window layer of group III-V semiconductor being provided in contact with the diffusive-concentration distribution-adjusting layer and having a bandgap energy larger than the bandgap energy of the diffusive-concentration distribution-adjusting layer, the absorption layer being disposed between the diffusive-concentration distribution-adjusting layer and the substrate, the diffusive-concentration distribution-adjusting layer being disposed between the absorption layer and the window layer, a maximum value of a concentration of donor in a predetermined region being not less than $5 \times 10^{15}$ cm$^{-3}$ and not more than $1 \times 10^{19}$ cm$^{-3}$, the predetermined region extending from a binding surface between the window layer and the diffusive-concentration distribution-adjusting layer into the window layer or the diffusive-concentration distribution-adjusting layer.

For two adjacent pixels of photo detectors, if the concentration of carrier is less than $5 \times 10^{15}$ cm$^{-3}$ or more than $1 \times 10^{19}$ cm$^{-3}$, a preferred pnp junction cannot be formed between the adjacent pixels. This leads to leak current between the adjacent pixels, resulting in increased dark current. Moreover, in the binding surface between the diffusive-concentration distribution-adjusting layer and the window layer, a preferred pnp junction cannot be formed between the adjacent pixels due to generation of the defects functioning as holes or carrier depletion caused by discontinuity of the bands. This leads to leak current in the adjacent pixels, resulting in increased dark current. According to the aspect of the present invention, the epitaxial wafer has an increased concentration of n-type carrier on the binding surface between the window layer and the diffusive-concentration distribution-adjusting layer, compared with the concentration of n-type carrier in the diffusive-concentration distribution-adjusting layer and the window layer, resulting in reduced dark current. The concentration of carrier in such a range can be achieved by doping with donor impurities.

In the epitaxial wafer, the maximum value of the concentration of donor in the predetermined region of the window layer may be higher than a maximum value of a concentration of donor in an outside region in contact with the predetermined region, the outside region lying in the window layer or the diffusive-concentration distribution-adjusting layer. Accordingly, the concentration of donor is increased only around the binding surface between the diffusive-concentration distribution-adjusting layer and the window layer, resulting in significantly reduced dark current.

In the epitaxial wafer, the donor may be Si. The use of Si facilitates the control of the concentration of n-type carrier or donor. Moreover, the thickness of the predetermined region may be not less than 0.02 μm and not more than 0.2 μm. The predetermined region having a thickness of less than 0.02 μm cannot compensate for the generation of the defects functioning as holes, or carrier depletion due to discontinuity of the bands, which cannot reduce dark current. The predetermined region having a thickness of more than 0.2 μm causes generation of excess n-type carriers, resulting in increased dark current.

Accordingly, the present invention provides a photo detector and an epitaxial wafer of group III-V semiconductor that can reduce dark current.

The foregoing and other objects, features and advantages of the present invention are more readily apparent from the detailed description of the preferred embodiments set forth bellow, taken in conjunction with the accompanying figures.

Advantageous Effects of Invention

As described above, one aspect of the present invention provides a group III-V compound semiconductor photo detector comprising an absorption layer and an n-type InP window layer that can reduce dark current, the absorption layer having a group III-V compound semiconductor layer containing Sb as a group V constituent element. Another aspect of the present invention provides a method of fabricating the group III-V compound semiconductor photo detector.

BRIEF DESCRIPTION OF DRAWINGS

FIG. 2 is a drawing showing major steps in the method of fabricating the group III-V compound semiconductor photo detector according to the embodiment.

FIG. 3 is a drawing showing major steps in the method of fabricating the group III-V compound semiconductor photo detector according to the embodiment.

FIG. 4 is a drawing showing major steps in the method of fabricating the group III-V compound semiconductor photo detector according to the embodiment.

FIG. 6 is a drawing showing the concentration of Sb in a second InGaAs layer and an InP window layer included in two kinds of the epitaxial wafers shown in FIG. 5, the concentration measured by secondary ion mass spectrometry.

FIG. 8 is a drawing showing a relation between the concentration of silicon, the concentration of electron or hole, and dark current, shown in Example 1.

FIG. 10 is a drawing explaining the effect of the photo detector according to the embodiment.

FIG. 12 is a drawing showing an example and a comparative example of the photo detector according to the embodiment.

FIG. 13 is a drawing showing an example and a comparative example of the photo detector according to the embodiment.

DESCRIPTION OF EMBODIMENTS

Aspects of the present invention is more readily understood from the detailed description of the preferred embodiments set forth bellow, taken in conjunction with the accompanying figures illustrated by way of example. According to the present invention, embodiments of a III-V group compound semiconductor photo detector, a method of fabricating the same, a photo detector, and an epitaxial wafer are explained with reference to the accompanying figures. Herein, like references indicate like elements.

(First Embodiment)

Figure 1:
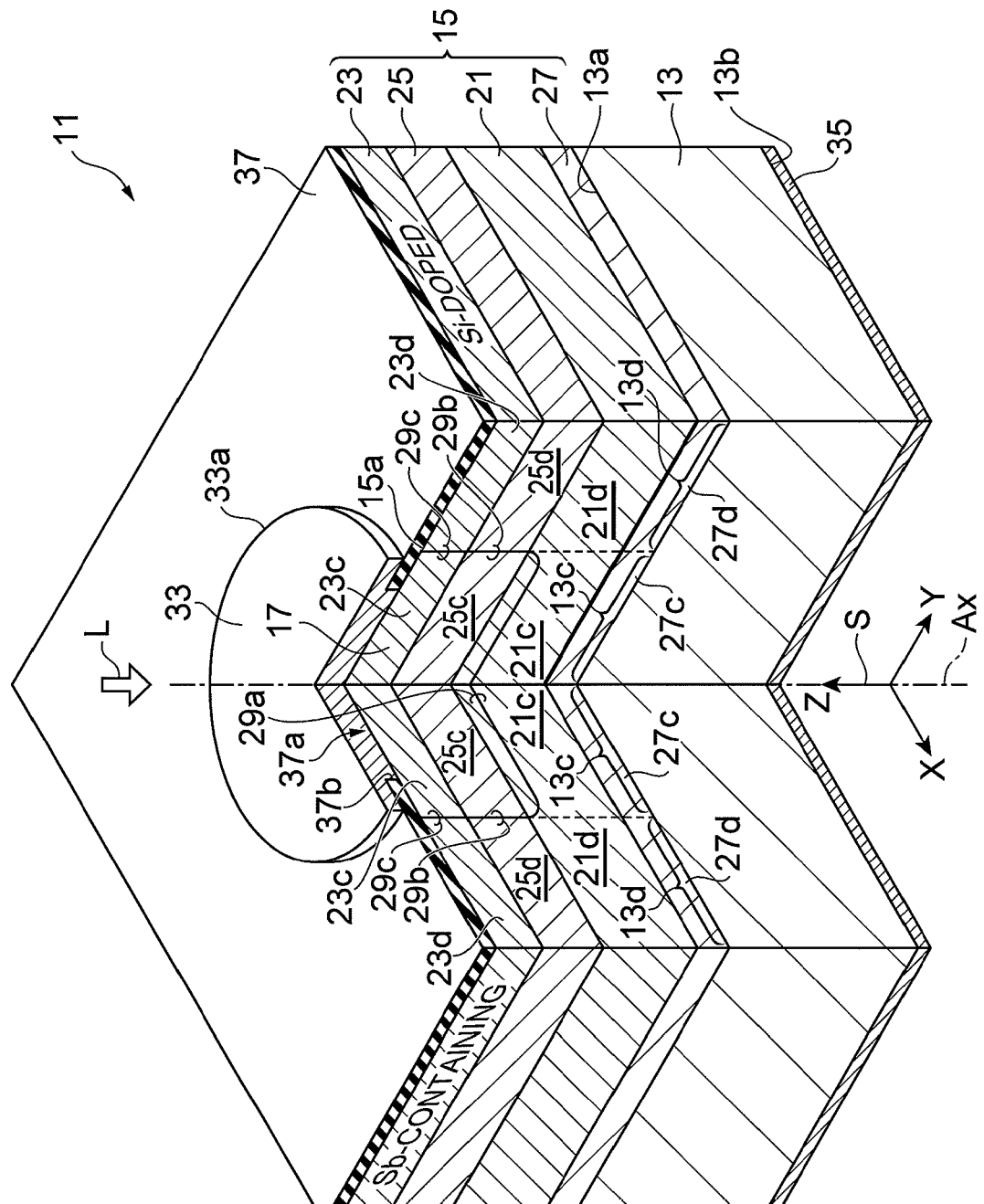
FIG. 1 is a drawing showing a structure of a group III-V compound semiconductor photo detector according to an embodiment.

FIG. 1 illustrates a group III-V compound semiconductor photo detector according to one embodiment of the present invention. The group III-V compound semiconductor photo detector is, for example, a photodiode. FIG. 1 is depicted by an orthogonal coordinate system S.

The group III-V compound semiconductor photo detector 11 includes a semiconductor substrate 13, a semiconductor layer stack 15, and an anode region 17. The semiconductor layer stack 15 is disposed on the semiconductor substrate 13, and includes an absorption layer 21 and an InP layer 23. In the semiconductor layer stack 15, semiconductor layers (for example, the absorption layer 21, and the InP layer 23) are deposited in the direction of the axis Ax normal to a principal surface 13a of the semiconductor substrate 13. The semiconductor substrate has the principal surface 13a and a rear surface 13b. The principal surface 13a includes a first area 13c and a second area 13d, the second area 13d surrounding the first area 13c. The absorption layer 21 is provided on the principal surface 13a of the semiconductor substrate 13, the absorption layer 21 being disposed between the semiconductor substrate 13 and the InP layer 23. The absorption layer 21 includes a group III-V compound semiconductor layer containing at least antimony as a V group constituent element. The group III-V compound semiconductor layer includes, for example, GaAsSb. The absorption layer 21 may includes, for example, a bulk structure or a quantum well structure. The group III-V compound semiconductor layer has the bandgap energy Eabsp which is smaller than the bandgap energy EInP of InP, so that electron-hole pairs are generated in the group III-V compound semiconductor layer by the light incident on a principal surface 15a of the semiconductor layer stack 15, in which the incident light reaches the absorption layer 21 through the InP layer 23. The absorption layer 21 has a first portion 21c and a second portion 21d, the first portion 21c and the second portion 21d being respectively disposed on the areas 13c, 13d. The InP layer 23 is provided on the absorption layer 21. The InP layer 23 also has a first portion 23c and a second portion 23d, the first portion 23c and the second portion 23d being respectively disposed on the areas 13c, 13d. The first portion 21c is disposed between the first portion 23c and the first area 13c. The second portion 21d is disposed between the second portion 23d and the second area 13d. The anode region 17 is constituted by p-type semiconductor extending from the surface of the first portion 23c of the InP layer 23 to the absorption layer 21. The anode region 17 is doped with p-type dopant. The p-type dopant may be, for example, zinc (Zn).

In the group III-V compound semiconductor photo detector 11, the InP layer 23 contains antimony as impurity, and is also doped with n-type dopant. The n-type dopant may be, for example, silicon, or sulfur. The majority carrier of the second portion 23d of the InP layer 23 is electron. The concentration of electron in the second portion 23d of the InP layer 23 is not less than $1\times10^{16}$ cm$^{-3}$.

In the group III-V compound semiconductor photo detector 11, the InP layer 23 grown on the absorption layer 21 contains antimony as impurity, which is derived from remaining antimony in a reactor after the growth of a group III-V compound semiconductor layer of the absorption layer 21 under supply of antimony (i.e., the memory effect). According to an investigation by the inventors, the antimony as impurity in the InP layer 23 generates holes. The n-type dopant in the InP layer 23 compensates for the generated carriers, so that the majority carrier in the second portion 23d of the InP layer 23 is electron. Since the concentration of electron is not less than $1\times10^{16}$ cm$^{-3}$, the second portion 23d of the InP layer 23 has sufficient n-type conductivity.

According to an investigation by the inventors, the concentration of antimony in the InP layer 23 may be in a range of not less than $1\times10^{17}$ cm$^{-3}$ and not more than $1\times10^{19}$ cm$^{-3}$. The concentration of antimony as impurity in the InP layer 23 is within the above range, in which at least part of the antimony impurities generate holes.

The concentration of electron in the second portion 23d of the InP layer 23 may be not more than $1\times10^{19}$ cm$^{-3}$. In the case where the concentration of electron in the second portion 23d is not more than $1\times10^{19}$ cm$^{-3}$, the anode region 17 can have proper electrical properties without an increase in p-type dopants to form the anode region. The concentration of silicon in the InP layer 23 may be in a range of not less than $1\times10^{16}$ cm$^{-3}$ and not more than $1\times10^{19}$ cm$^{-3}$.

The absorption layer 21 may have at least one structure of a multiple quantum well structure having an InGaAs layer and a GaAsSb layer, and a multiple quantum well structure having a GaInNAs layer and a GaAsSb layer. The group III-V compound semiconductor layer may include a GaAsSb layer. In the photo detector 11, the resulting absorption layer 21 has desired wavelength sensitivity.

In the group III-V compound semiconductor photo detector 11, the semiconductor layer stack 15 may be further provided with an InGaAs layer 25. The InGaAs layer 25 is disposed between the absorption layer 21 and the InP layer 23. Although antimony may be detected as impurity in the InGaAs layer 25 in some cases, the concentration of antimony in the InP layer 23 is higher than the concentration of antimony in the InGaAs layer 25. The InGaAs layer 25 can be used to align the anode region 17 relative to the absorption layer 21. Although the InGaAs layer 25 may contain antimony as impurity in some cases, the concentration of antimony in the InP layer 23 is higher than the concentration of antimony in the InGaAs layer 25. Thus, the InGaAs layer 25 can remain undoped. The InGaAs layer 25 may be also thicker than the InP layer 23.

The InGaAs layer 25 has a first portion 25c disposed on the first area 13c, and a second portion 25d on the second area 13d. The anode region 17 includes the first portion 25c and the first portion 23c, and is disposed on the first portion 21c. The rear surface of the anode region 17 and the first portion 21c generate a p-n junction 29a. The side surface of the anode region 17 and the second portion 25d generate a p-n junction 29b. The side surface of the anode region 17 and the second portion 23d generate a p-n junction 29c.

In the group III-V compound semiconductor photo detector 11, the semiconductor layer 15 may be further provided with another InGaAs layer 27. The InGaAs layer 27 is disposed between the absorption layer 21 and the semiconductor substrate 13. The InGaAs layer 27 does not substantially contain antimony as impurity. The bandgap energy of the InGaAs layer 27 is lager than the bandgap energy of the group III-V compound semiconductor layer in the absorption layer 21. The InGaAs layer 27 is doped with n-type dopant. The n-type dopant may be, for example, silicon (Si). The concentration of silicon in the InGaAs layer 27 may be, for example, not less than $1\times10^{16}$ cm$^{-3}$ and not more than $1\times10^{19}$ cm$^{-3}$. The InGaAs layer 27 has a first portion 27c disposed on the first area 13c, and a second portion 27d disposed on the second area 13d. The InGaAs layer 27 is in contact with an InP semiconductor region.

The semiconductor substrate 13 may be constituted by, for example, InP. The InP has conductivity. If necessary, it is feasible to provide a buffer layer on the principal surface 13a of the semiconductor substrate 13. The buffer layer may be constituted by, for example, InP.

The InP substrate can provide an absorption layer having a preferred light-receiving sensitivity. Moreover, the anode region 17, and the cathode of the InP substrate can provide preferred light-receiving properties, in which the anode region 17 is constituted by p-type semiconductor extending from the surface of the first portion 23c of the InP layer 23 to the absorption layer. The absorption layer 21 can have the light-receiving sensitivity over a wavelength range of not less than 1.0 µm and not more than 3.0 µm.

The group III-V compound semiconductor photo detector 11 can include an anode electrode 33 in contact with the principal surface 15a of the semiconductor layer stack 15. The edge 33a of the anode electrode 33 is disposed within an imaginary columnar surface extending through the boundary of the first area 13c in the direction of the normal axis Ax. The p-n junctions 29b and 29c are disposed nearly along the imaginary columnar surface. An arbitrary reference plane crossing the axis Ax is defined in the coordinate system S having the Z axis on the axis Ax, the axis Ax penetrating the middle of the anode electrode 33. On the reference plane, the X-coordinate value and the Y-coordinate value at the edge 33a of the anode electrode 33 are smaller than those at the boundary of the first area 13c.

The group III-V compound semiconductor photo detector 11 can be further provided with a cathode electrode 35 on the rear surface 13b of the semiconductor substrate 13. The cathode electrode 35 covers the rear surface 13b of the semiconductor substrate 13, and is in contact with the rear surface 13b.

The group III-V compound semiconductor photo detector 11 can be further provided with an insulating layer 37 covering the surface of the second portion 23d of the InP layer 23, the insulating layer 37 functioning as a passivation layer. The insulating layer 37 has an opening 37a. The opening 37a provides a path for a contact between the anode electrode 33 and the InP layer 23. The photo detector 11 can reduce surface leak current, and dark current attributed to a material of the window layer 23.

The edge 37b of the opening 37a on the insulating layer 37 is disposed within the imaginary columnar surface crossing the boundary of the first area 13c in the direction of the normal axis Ax. On the reference plane, the X-coordinate value of the edge 33a of the anode electrode 33 can take a value between the X-coordinate value of the edge 37b of the opening 37a on the insulating layer 37 and the X-coordinate value of the p-n junction 29b or 29c. The Y-coordinate value of the edge 33a of the anode electrode 33 can take a value between the Y-coordinate value of the edge 37b of the opening 37a on the insulating layer 37 and the Y-coordinate value of the p-n junction 29b or 29c.

FIGS. 2 to 4 illustrate major steps of fabricating the group III-V compound semiconductor photo detector, according to the embodiment. The steps of fabricating the group III-V compound semiconductor photo detector are explained below with reference to FIGS. 2 to 4. In Step S101, a substrate 41 is disposed in a reactor 10a. The substrate 41 may be, for example, an InP substrate. In Step S102, a semiconductor layer stack Epi for the group III-V semiconductor photo detector is grown in the reactor 10a. The following epitaxial growth is carried out by metal-organic vapor phase epitaxy, for example. In the metal-organic vapor phase epitaxy, TEGa, TMIn, TBAs, TBP, and TMSb can be respectively used as gallium (Ga) source, Indium (In) source, arsenic (As) source, phosphorous (P) source, and antimony (Sb) source. For n-type doping, for example, TeESi can be used.

In Step S102-1, a first InGaAs layer 43 is grown on the principal surface 41a of a substrate 41 by supplying a first source into the reactor 10a. The first source G1 contains gallium source, indium source, and arsenic source. The first source G1 may further contain TeESi as n-type dopant.

As shown in Part (b) of FIG. 2, in a step S102-2, the absorption layer 45 is grown on the principal surface 41a of the substrate 41 by supplying a second source G2 in the reactor 10a. The absorption layer 45 includes a group III-V compound semiconductor layer having at least antimony as a group V element. The bandgap energy of the group III-V compound semiconductor layer is smaller than the bandgap energy of the InP which is grown as a window layer in a subsequent step. In the embodiment, the second source G2 contains, for example, gallium source, arsenic source, and antimony source, so that a single GaAsSb layer is grown on the principal surface of the first InGaAs layer 43. The GaAsSb layer may be, for example, undoped, in which the majority carrier is electron.

The absorption layer 45 may have at least one structure of a single quantum well or a multiple quantum well structure having an InGaAs layer and a GaAsSb layer, and a single quantum well or a multiple quantum well structure having a GaInNAs layer and a GaAsSb layer. In this structure, the absorption layer 45 having desired wavelength sensitivity can be obtained. The Sb-doped group III-V compound semiconductor layer may include a GaAsSb layer.

The absorption layer 45 may include, for example, a type-II quantum well structure having a pair of an $In_xGa_{1-x}As$ ($0.38 \leq x \leq 0.68$) layer and a $GaAs_{1-y}Sb_y$ ($0.36 \leq y \leq 0.62$) layer, or a pair of a $Ga_{1-u}In_uN_vAs_{1-v}$ ($0.4 \leq u \leq 0.8$, $0 < v \leq 0.2$) layer and a $GaAs_{1-z}Sb_z$ ($0.36 \leq z \leq 0.62$) layer.

If necessary, the fabrication process may involve a step of interrupting the epitaxial growth while the arsenic source for example is being supplied to a reactor after stopping supply of the gallium source and the antimony source.

As shown in Part (a) of FIG. 3, in Step S102-3, a second InGaAs layer 47 is grown on the absorption layer 45 by supplying a third source G3 into the reactor 10a after stopping supply of the antimony source into the reactor 10a. The third source G3 contains the gallium source, the indium source, and the arsenic source. The InGaAs layer 47 may be, for example, undoped, in which the majority carrier is electron.

As shown in Part (b) of FIG. 3, in Step S102-4, no antimony source is supplied into the reactor 10a. An InP layer 49 having n-type conductivity is grown on the absorption layer 45 and on the second InGaAs layer 47 by supplying a fourth source G4 into the reactor 10a. The fourth source G4 contains, for example, the n-type dopant, the indium source, and the phosphorous source.

The InP layer 49 contains n-type dopant (for example, silicon), and antimony as impurity. In the InP layer 49, the majority carrier is electron. The concentration of electron in the InP layer 49 is not less than $1 \times 10^{16}$ cm$^{-3}$.

Through these steps, an epitaxial wafer E is prepared. In Step S103, after the InP layer 49 is formed on the substrate 41, the epitaxial wafer E is brought out from the reactor 10a.

In Step S104, an anode region 51 of p-type semiconductor is formed on the epitaxial wafer E. In the embodiment, the anode region 51 is formed by introducing p-type dopant. The p-type dopant is introduced, for example, by thermal diffusion. After the epitaxial wafer E is brought out from the reactor 10a, an insulating layer 53 is formed on the epitaxial wafer E. The insulating layer 53 has an opening 53a provided above the position of the anode region 51. Thus, the anode region 51 extending into the absorption layer 45 is formed by introducing p-type dopant from the surface 49a of the InP layer 49 under zinc source atmosphere in a heat treatment unit 10b. In the heat treatment, the Zn introduced through the opening 53a diffuses in the lateral direction and toward the substrate. As a result, the anode region 51 also spreads below the insulating layer 53. In this step, a substrate product P is prepared. If necessary, the thickness of the InGaAs layer 47 can be determined so as to align the anode region 51 relative to the absorption layer 45, during the formation of the anode region 51.

In Step S105, an electrode is formed on the substrate product P. For example, an anode electrode 55 is formed in contact with the anode region 51, and a cathode electrode 57 is formed in contact with the rear surface of the substrate 41.

According to the method, although the InP layer 49 is grown on the absorption layer 45 without supplying antimony into the reactor 10a, the InP layer 49 contains antimony as impurity, which is derived from remaining antimony in the reactor 10a after the growth of the Sb-doped group III-V compound semiconductor layer of the absorption layer 45 (i.e., the memory effect). According to an investigation by the inventors, the antimony as impurity in the InP layer 49 generates holes. The n-type dopant doped in the InP layer 49 compensates for the generated carriers, so that in the InP layer 49 the majority carrier is electron. Since the concentration of electron is not less than $1 \times 10^{16}$ cm$^{-3}$, the InP layer 49 has sufficient n-type conductivity. The concentration of electron in the InP layer 49 may be not more than $1 \times 10^{19}$ cm$^{-3}$. In this case, the anode region 51 can have proper electrical properties without an increase in p-type dopants to form the anode region 51.

According to an estimation by the inventors, the concentration of antimony in the InP layer 49 is in a range of not less than $1 \times 10^{17}$ cm$^{-3}$ and not more than $1 \times 10^{19}$ cm$^{-3}$. The concentration of antimony as impurity in the InP layer 49 is within the above range, in which part of the antimony impurities generate holes.

The InGaAs layer 47 also contains antimony as impurity, in which the concentration of antimony in the InGaAs layer 47 is lower than the concentration of antimony in the InP layer 49. Although the InGaAs layer 47 contains antimony as impurity, the concentration of antimony in the InP layer 49 is higher than the concentration of antimony in the InGaAs layer 47. Hence, the InGaAs layer 47 can remain undoped. If necessary, the InGaAs layer 47 may be doped with a slight amount of n-type dopants.

As described above, the layer stack from the absorption layer 45 to the InP layer 49 is grown by metal-organic vapor phase epitaxy. According to the method, although the absorption layer 45 and the InP layer 49 can have preferred properties, the memory effect with antimony is inevitable during the growth of InP. However, according to the investigation by the inventors, the disadvantage of formation of a p-type semiconductor due to the memory effect with antimony can be avoided by doping of the InP layer with n-type dopant.

Figure 5:
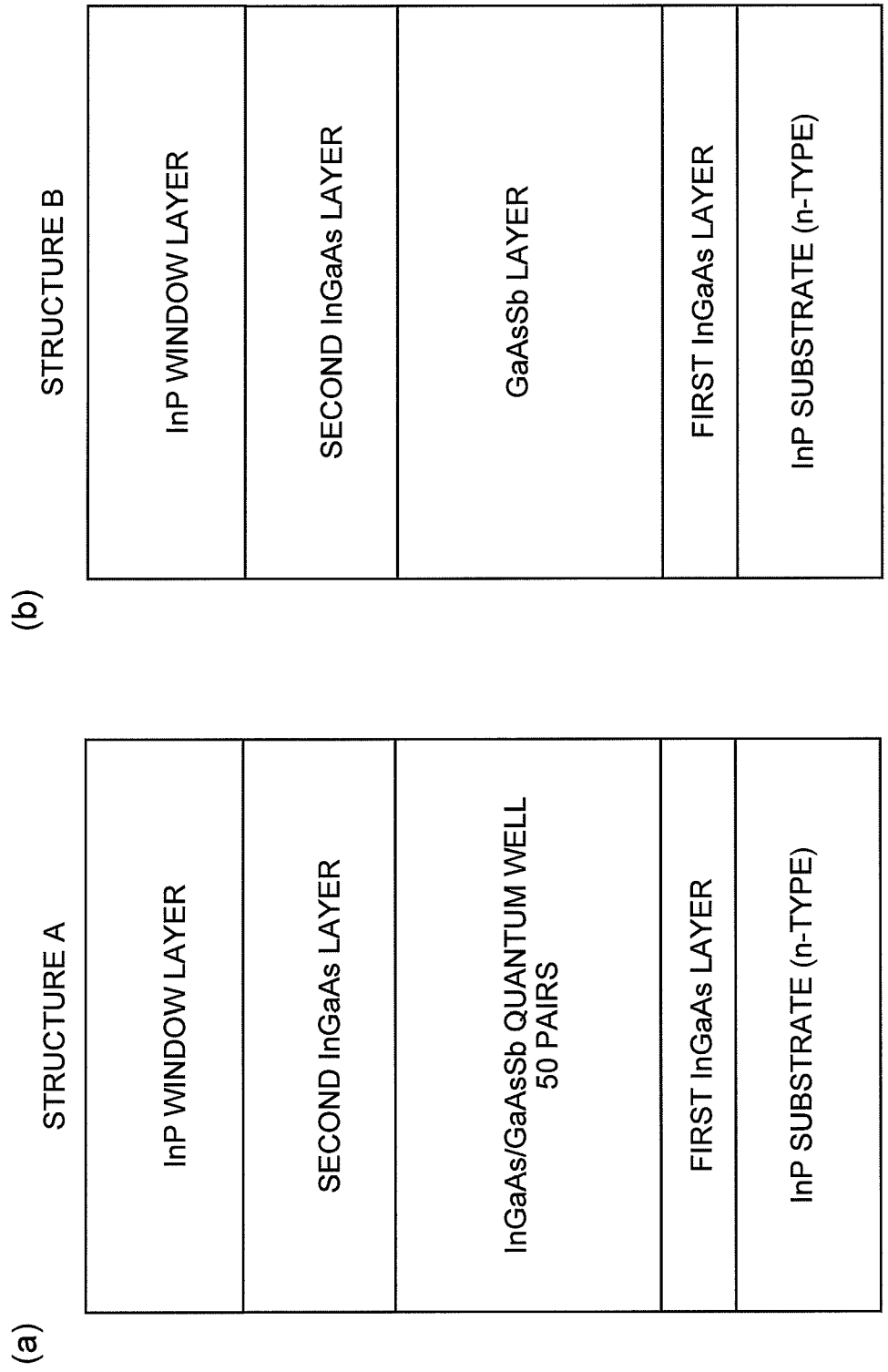
FIG. 5 is a drawing showing structures of two kinds of epitaxial wafers.

FIG. 5 illustrates two structures of epitaxial wafers. In Part (a) of FIG. 5, the epitaxial wafer has a multiple quantum well structure having an InGaAs layer and a GaAsSb layer as an absorption layer. In Part (b) of FIG. 5, the epitaxial wafer has a GaAsSb layer as an absorption layer. FIG. 6 shows the Sb concentrations measured by secondary ion mass spectrometry in a second InGaAs layer and an InP window layer for the two structures of the epitaxial wafers shown in FIG. 5. Referring to Part (a) of FIG. 5 and FIG. 6, the InP window layer in the structure A contains antimony in an amount of about $1 \times 10^{18}$ cm$^{-3}$. In contrast, in the second InGaAs layer disposed between the GaAsSb absorption layer and the InP window layer, the concentration of antimony is less than $1 \times 10^{16}$ cm$^{-3}$, which is below the detection limit of the secondary ion mass spectrometry. For the structure A, through the C-V measurement of carriers, the measured concentration of hole in the InP window layer is $1 \times 10^{16}$ cm$^{-3}$. Referring to Part (b) of FIG. 5 and FIG. 6, the InP window layer in the structure B contains antimony in an amount of about $1 \times 10^{19}$ cm$^{-3}$. In contrast, in the second InGaAs layer disposed between the GaAsSb absorption layer and the InP window layer, the concentration of antimony is less than $1 \times 10^{16}$ cm$^{-3}$, which is below the detection limit of the secondary ion mass spectrometry. For the structure B, through the C-V measurement of carriers, the measured concentration of hole in the InP window layer is $2 \times 10^{17}$ cm$^{-3}$. As shown in FIGS. 5 and 6, the profile of the Sb concentration falls once in the second InGaAs layer, but rises again in the InP layer during the growth of the InP layer after growing the InGaAs layer.

Figure 7:
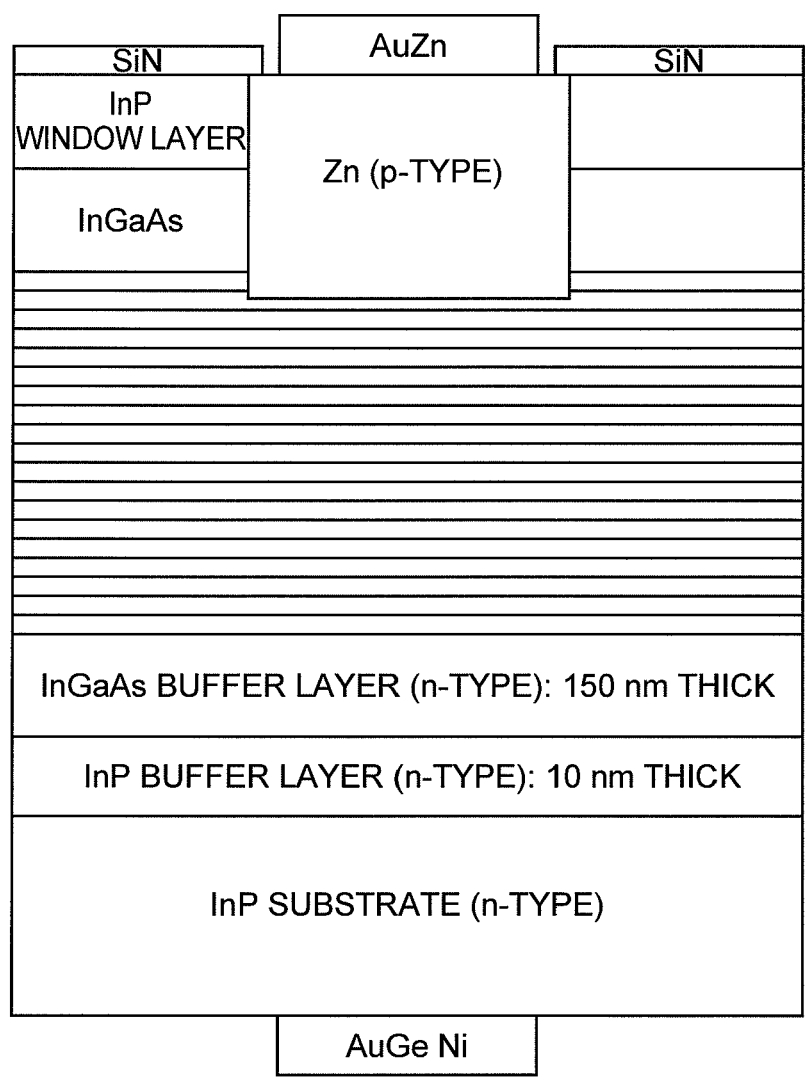
FIG. 7 is a drawing showing a structure of a photodiode shown in Example 1.

(Example 1) A photodiode depicted in FIG. 7 was fabricated. An n-type InP substrate was prepared. An n-type InP buffer layer was grown on the InP substrate heated at 500° C. by supplying TMIn (trimethylindium) and TBP (tert-butylphosphine) into a reactor. The buffer layer was 10 nm thick, for example, and was doped with n-type dopant by using TeESi. An n-type InGaAs layer was then grown on the n-type InP buffer layer at 500° C. by supplying TMIn (trimethylindium), TEGa (triethylgallium), and TBA (tert-butylarsine) into the reactor. The InGaAs layer was 150 nm thick, for example. Subsequently, an absorption layer having a multiple quantum well structure was formed. In Example 1, the absorption layer had a multiple quantum well structure of InGaAs/GaAsSb. A unit quantum well structure was constituted by a 5 nm thick InGaAs layer and a 5 nm thick GaAsSb layer, in which 50 pairs (the number of the repeated unit quantum wells) of the unit quantum well structure were grown in the multiple quantum well structure. TMSb was used as Sb source. A 1 μm thick InGaAs layer was then grown on the absorption layer at 500° C. The InGaAs layer functioned as a diffusive-concentration distribution-adjusting layer during the introduction of Zn by diffusion. Finally, a 1 μm thick n-type InP window layer was grown at 500° C. The n-type InP window layer was doped with silicon. As shown in FIG. 8, photodiodes A2 to A7 (Examples A2 to A7) were fabricated with different concentrations of silicon in the n-type InP window layers. Instead of the photodiodes having the silicon-doped n-type InP window layers, a photodiode A1 having an undoped InP window layer was also fabricated, in which neither silicon nor any other dopant was intentionally introduced. In Examples A1 to A7, the concentrations of silicon were measured by secondary ion mass spectroscopy. The type of the carrier, and the concentration of electron or hole were measured through the C-V measurement. In Examples A2 to A7, the concentration of silicon ranged from $5 \times 10^{15}$ cm$^{-3}$ to $5 \times 10^{19}$ cm$^{-3}$. In Example A1, the concentration of silicon was less than $1 \times 10^{15}$ cm$^{-3}$, which was below the detection limit of secondary ion mass spectrometry. In Examples A1 and A2, the carrier was of p-type. The concentration of hole was $1 \times 10^{16}$ cm$^{-3}$ in Example A1, and $5 \times 10^{15}$ cm$^{-3}$ in Example A2. In contrast, in Examples A3 to A7, the carrier was of n-type. The concentration of electron was $5 \times 10^{15}$ cm$^{-3}$ in Example A3, $1 \times 10^{16}$ cm$^{-3}$ in Example A4, $1 \times 10^{17}$ cm$^{-3}$ in Example A5, $1 \times 10^{19}$ cm$^{-3}$ in Example A6, and $5 \times 10^{19}$ cm$^{-3}$ in Example A7.

In Examples A1 to A7, an SiN layer was grown on the surface of the InP window layer, and then an opening was formed by patterning the SiN layer. After this, through the opening, Zn was selectively diffused to form a p-type region which extended toward the inside of the absorption layer of an InGaAs/GaAsSb multiple quantum well structure. Subsequent to the formation of the anode region by the selective diffusion of Zn, a p-side electrode of AuZn was formed on the surface of the InP window layer, and an n-side electrode of AuGeNi on the rear surface of the substrate.

In another example, instead of the InGaAs/GaAsSb absorption layer, an absorption layer of a GaInNAs/GaAsSb multiple quantum well structure was formed. The unit quantum well structure was constituted by a 5 nm thick GaInNAs layer and a 5 nm thick GaAsSb layer, in which 50 pairs (the number of the repeated unit quantum wells) of the unit quantum well were grown. TMSb was used as Sb source.

The reverse current-voltage characteristics in the fabricated photodiodes were investigated at room temperature. The photodiodes have light-receiving areas of 100 μm diameters. In Examples A1 and A2, the photodiodes had leak current of 20 gA at room temperature under an applied voltage of −5 V. In Example A3, the photodiode had leak current of 10 gA at room temperature under an applied voltage of −5 V. In contrast, in Examples A4 to A6, the photodiodes had leak current of 2 gA at room temperature under an applied voltage of −5 V. In Example 7, the photodiode had leak current of 200 gA at room temperature under an applied voltage of −5 V. Accordingly, the dark current was reduced by about one order of magnitude by doping of the InP window layers with silicon as n-type dopant (the electron concentrations ranged from $1 \times 10^{16}$ cm$^{-3}$ to $1 \times 10^{19}$ cm$^{-3}$).

(Second Embodiment)

In recent years, a number of researches on group III-V based compound semiconductors containing InP substrates have been carried out because the group III-V based compound semiconductors have a bandgap energy corresponding to the frequency range in the near-infrared. A nonpatent literature (R. Sidhu, "Long-wavelength Photo detector on InP Using Lattice-Matched GaInAs—GaAsSb Type-II Quantum Wells", IEEE Photonics Technology Letters, Vol. 17, No. 12, (2005) pp. 2715-2717) discloses a photodiode having a cutoff wavelength of 2.39 μm, in which an absorption layer of a type-II InGaAs—GaAsSb quantum well structure is formed on an InP substrate, and a p-n junction is formed in a p-type or n-type epitaxial layer. This nonpatent literature (Nonpatent Literature 2) also proposes a photodiode having a cutoff wavelength ranging from 2 μm to 5 μm, in which a strain-compensated InGaAs—GaAsSb quantum well structure is formed because the strain-compensated structure is needed to achieve such longer cutoff wavelengths. However, in Nonpatent Literature 2, since an electrode and a passivation layer are formed on an InGaAs layer, generation of relatively large dark current is predicted. In particular, technologies for forming a passivation layer on a crystalline surface of InGaAs have not been developed enough to reduce dark current. The second embodiment of the present invention provides a photo detector of group III-V semiconductor having reduced dark current, and an epitaxial wafer of group III-V semiconductor having reduced dark current.

Figure 9:
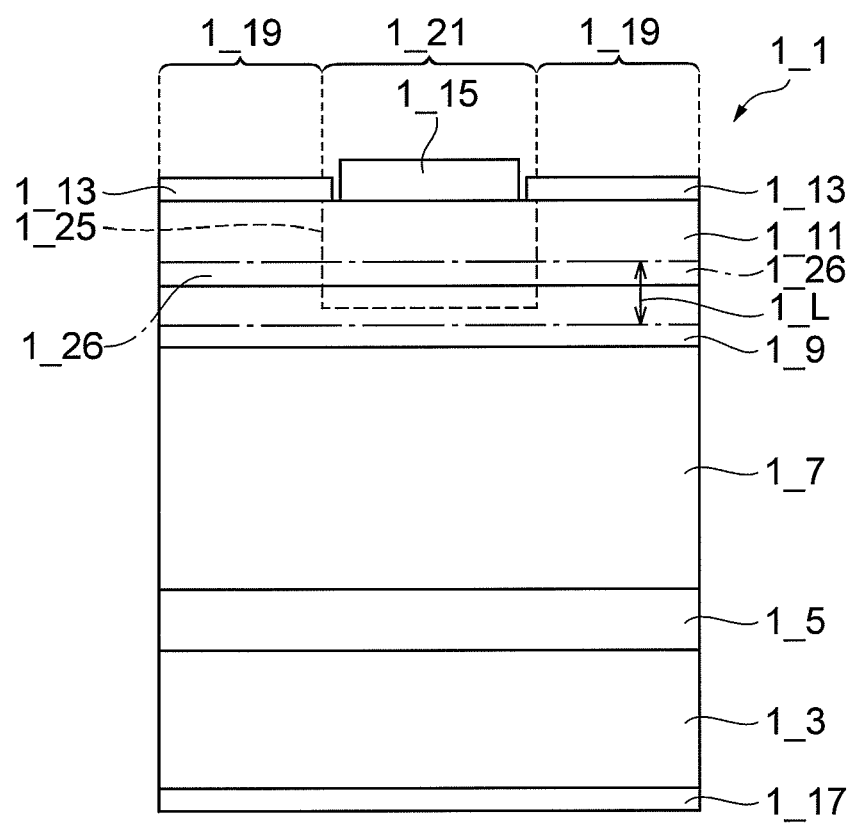
FIG. 9 is a drawing explaining a structure of a photo detector according to the embodiment.

FIG. 9 illustrates a structure of a photo detector 1_1 according to the second embodiment. The photo detector 1_1 is provided with a substrate 1_3, a semiconductor layer 1_5, an absorption layer 1_7, a diffusive-concentration distribution-adjusting layer 1_9, a window layer 1_11, an insulating layer 1_13, a p-type electrode 1_15, and an n-type electrode 1_17. The semiconductor layer 1_5 is formed on a buffer layer of n-type InP (not shown) overlying the substrate 1_3. The buffer layer is in contact with the rear surface of the semiconductor layer 1_5.

The absorption layer 7 is formed on the surface of the semiconductor layer 1_5, and the diffusive-concentration distribution-adjusting layer 1_9 is disposed on the absorption layer 1_7. The rear surface of the diffusive-concentration distribution-adjusting layer 1_9 is in contact with the absorption layer 1_7. The absorption layer 1_7 is disposed between the semiconductor layer 1_5 and the diffusive-concentration distribution-adjusting layer 1_9 (i.e., the absorption layer 1_7 is disposed between the substrate 1_3 and the diffusive-concentration distribution-adjusting layer 1_9). The absorption layer 1_7 has a multiple quantum well structure, in which quantum well layers and barrier layers are stacked alternately.

The diffusive-concentration distribution-adjusting layer 1_9 is disposed between the absorption layer 1_7 and the window layer 1_11. The window layer 1_11 is disposed on the diffusive-concentration distribution-adjusting layer 1_9, and the rear surface of the window layer 1_11 is in contact with the surface of the diffusive-concentration distribution-adjusting layer 1_9. The insulating layer 1_13 is disposed on the surface of the window layer 1_11, and has an opening. The p-type electrode 1_15 is disposed on the surface of the window layer 1_11, and is in contact with the surface of the window layer 1_11.

A semiconductor region of the diffusive-concentration distribution-adjusting layer 1_9 and the window layer 1_11 has a second region 1_19 and a first region 1_21. The first region 1_21 has a surface in contact with the second region 1_19. The first region 1_21 is an impurity diffusive region 1_25 having (doped with) a predetermined impurity element (Zn in the embodiment).

The p-type electrode 1_15 is disposed in the opening of the insulating layer 1_13. The contact between the p-type electrode 1_15 and the window layer 1_11 is ohmic. The n-type electrode 1_17 is disposed on the rear surface of the substrate 1_3, and is in contact with this rear surface. The contact between the n-type electrode 1_17 and the substrate 1_3 is ohmic.

The substrate 1_3 is constituted by group III-V semiconductor, InP. The substrate 1_3 is S-doped, and has n-type conductivity. The buffer layer (not shown) on the substrate 1_3 is constituted by n-type InP, and is about 10 nm thick. The semiconductor layer 1_5 is constituted by n-type InGaAs, and is about 150 nm thick. The absorption layer 1_7 has a type-II multiple quantum well structure, in which InGaAs layers and GaAsSb layers are stacked alternately. The absorption layer 1_7 includes, for example, 50 pairs of layers, each pair being constituted by an InGaAs layer and a GaAsSb layer. The InGaAs layer is about 5 nm thick, and the GaAsSb layer is about 5 nm thick. The compositions of the InGaAs layer and the GaAsSb layer in the absorption layer 1_7 are $In_xGa_{1-x}As$ (0.38≤x≤0.68) and $GaAs_{1-y}Sb_y$ (0.36≤y≤0.62), respectively. The absorption layer 1_7 may include 50 pairs of layers, each pair being constituted by a $Ga_{1-t}In_tN_uAs_{1-u}$ (0.4≤t≤0.8, 0<u≤0.2) layer and a $GaAs_{1-v}Sb_v$ (0.36≤v≤0.62) layer.

The diffusive-concentration distribution-adjusting layer 1_9 is constituted by group III-V semiconductor, InGaAs, and is about 1.0 μm thick. The diffusive-concentration distribution-adjusting layer 1_9 is undoped.

The window layer 1_11 is constituted by group III-V semiconductor, InP, and is about 0.8 μM thick. The window layer 1_11 has a bandgap energy larger than the bandgap energy of the diffusive-concentration distribution-adjusting layer 1_9. The window layer 1_11 is doped with an n-type dopant, Si. A portion of the diffusive-concentration distribution-adjusting layer 1_9 included in the first region 1_21, and a portion of the window layer 1_11 included in the first region 1_21 have p-type conductivity, while a portion of the window layer 1_11 included in the second region 1_19 has n-type conductivity. The conductivity of the second region 1_19 is different from the conductivity of the first region 1_21. In a predetermined region 1_26 extending from the binding surface between the window layer 1_11 and the diffusive-concentration distribution-adjusting layer 1_9 (i.e., the rear surface of the window layer 1_11, the surface of the diffusive-concentration distribution-adjusting layer 1_9, or the interface between the window layer 1_11 and the diffusive-concentration distribution-adjusting layer 1_9) into at least the window layer 1_11, the concentration of n-type carrier or donor (Si) is in a range of not less than $5 \times 10^{15}$ cm$^{-3}$ and not more than $1 \times 10^{19}$ cm$^{-3}$. The region 1_26, which extends into the window layer 1_11 alone in FIG. 9, can also extend into the diffusive-concentration distribution-adjusting layer 1_9. The thickness L of the region 1_26 (the width of the region 1_26 extending from the binding surface between the window layer 1_11 and the diffusive-concentration distribution-adjusting layer 1_9 into the window layer 1_11 or into the diffusive-concentration distribution-adjusting layer 1_9) approximately ranges from 0.02 μm to 0.2 μm. The region 1_26 having a thickness of less than 0.02 μm cannot compensate for the generation of the defects functioning as holes and the depletion of carriers due to discontinuity of the bands, which cannot reduce dark current. The region 1_26 having a thickness of more than 0.2 μm causes generation of excess n-type carriers, resulting in increased dark current.

Figure 11:
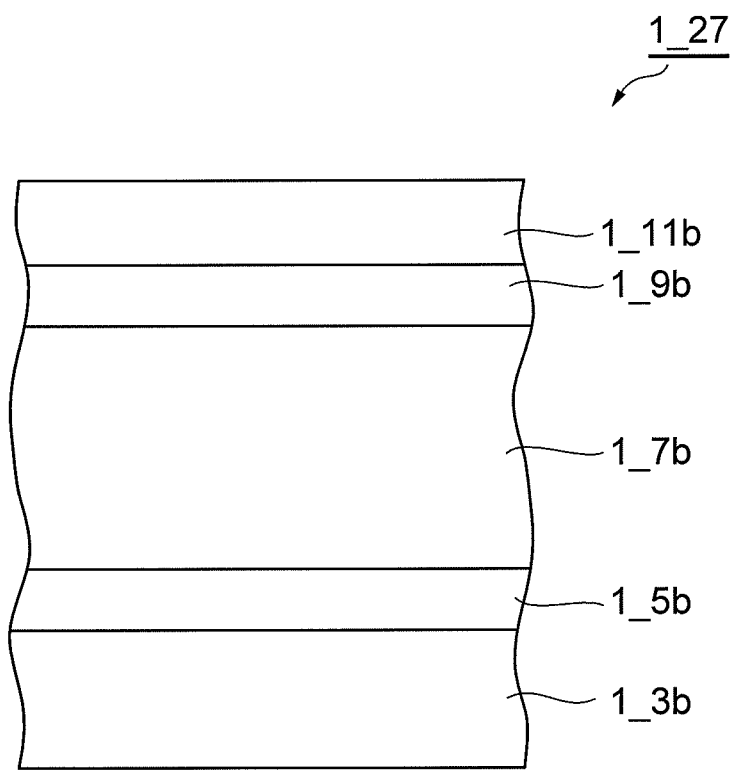
FIG. 11 is a drawing explaining a structure of an epitaxial wafer according to the embodiment.

The method of fabricating the photo detector 1_1 are described below. TEGa, TMIn, IBAs, TBP, and TMSb are respectively used as sources of Ga, In, As, P, and Sb. TeESi is also used for doping with n-type dopant. First, the epitaxial wafer 1_27 shown in FIG. 11 is fabricated by MOVPE. An S-doped substrate 1_3b is prepared. A 10 nm buffer layer (not shown) of n-type doped InP is grown on the S-doped substrate 1_3b, and then a 0.15 μm semiconductor layer 1_5b of n-type doped InGaAs is grown on this buffer layer. An absorption layer 1_7b including a type-II multiple quantum well structure of InGaAs—GaAsSb is grown on the semiconductor layer 1_5b. The multiple quantum well structure has 50 pairs of layers, each pair being constituted by a 5 nm thick undoped InGaAs layer and a 5 nm thick undoped GaAsSb layer, in which the undoped InGaAs layers and the undoped GaAsSb layers are stacked alternately on the substrate. All the layers from the buffer layer to the absorption layer are epitaxially grown at 500° C. In the epitaxial growth of all the layers from the buffer layer to the absorption layer, TEGa, TBAs, and TMSb are used as source gases for the growth of GaAsSb. TEGa, TMIn, and TBAs are used for the growth of InGaAs. TMIn and TBP are used for the growth of InP.

Subsequently, the diffusive-concentration distribution-adjusting layer 1_9b of InGaAs is grown on the absorption layer 1_7b at 500° C., and then the window layer 1_11 of InP is grown on the diffusive-concentration distribution-adjusting layer 1_9b. During the growths of the 0.05 μm thick region extending from the binding surface between the diffusive-concentration distribution-adjusting layer 1_9b and the window layer 1_11b into the diffusive-concentration distribution-adjusting layer 1_9b, and the 0.05 μm thick region extending from the binding surface between the diffusive-concentration distribution-adjusting layer 1_9b and the window layer 1_11b into the window layer 1_11b, the supply of TeESi is adjusted such that these regions can have one of the concentrations of n-type carrier which are described below in Examples A8 to A11.

After the fabrication of the epitaxial wafer 1_27 as described above, the photo detector 1_1 is fabricated using the epitaxial wafer 1_27. A p-type region (corresponds to an impurity diffusive region 1_25 in the photo detector 1_1) extending from the surface of the window layer 1_11b toward the rear surface of the absorption layer 1_7b is formed by selectively diffusing Zn as p-type impurity through an opening of a selective-diffusion mask pattern in a SiN layer. The p-type electrode 1_15 of AuZn is disposed on the surface of the window layer 1_11b included in the p-type region, and the n-type electrode 1_17 of AuGeNi is disposed on the rear surface of the substrate 13b, such that these electrodes have ohmic contact. A SiON layer as an antireflective layer is further disposed on the rear surface of the substrate 1_3b in order to prevent reflection on the rear surface (adjacent to the substrate 1_3b) of the substrate 1_27 and thus to reduce, for example, crosstalk in the case where the incident surface is the surface (adjacent to the window layer 1_11b) of the epitaxial wafer 1_27. As described above, the photo detector 1_1 is fabricated using the epitaxial wafer 1_27. In the case where the incident surface is the rear surface (adjacent to the substrate 1_3) of the epitaxial wafer 1_27, the n-type electrode 1_17 is formed into a ring or frame shape, and then provided with an antireflective layer of SiON in the middle of the ring or frame, so that the entrance efficiency of the light to be measured is improved.

The substrate 1_3 of the photo detector 1_1 is a portion of the substrate 1_3b of the epitaxial wafer 1_27. The semiconductor layer 1_5 of the photo detector 1_1 is a portion of the semiconductor layer 1_5b of the epitaxial wafer 1_27. The absorption layer 1_7 of the photo detector 1_1 is a portion of the absorption layer 1_7b of the epitaxial wafer 1_27. The diffusive-concentration distribution-adjusting layer 1_9 of the photo detector 1_1 is a portion of the diffusive-concentration distribution-adjusting layer 1_9b of the epitaxial wafer 1_27. The window layer 1_11 of the photo detector 1_1 is a portion of the window layer 1_11b of the epitaxial wafer 1_27.

FIGS. 12 and 13 show the concentrations of n-type carrier and donor in Examples A8 to A11, and Comparative Examples 1 to 3 relative to Examples A8 to A11. Part (a) of FIG. 10 shows a structure of a photo detector 1_1 a in Comparative Examples 1 to 3. The photo detector 1_1 a is provided with a substrate 1_3a, a semiconductor layer 1_5a, an absorption layer 1_7a, a diffusive-concentration distribution-adjusting layer 1_9a, a window layer 1_11a, a p-type electrode 1_15a, an n-type electrode 1_17a, and an impurity diffusive region 1_25a, which respectively correspond to the substrate 1_3, the semiconductor layer 1_5, the absorption layer 1_7, the diffusive-concentration distribution-adjusting layer 1_9, the window layer 1_11, the p-type electrode 1_15, the n-type electrode 1_17, and the impurity diffusive region 1_25a in the photo detector 1_1. The photo detector 1_1a also has a region 1_26a (not shown) corresponding to the region 1_26 of the photo detector 1_1.

FIG. 12 shows the measured maximum concentrations of n-type carrier in the window layer 1_11 or 1_11a, the measured maximum concentration of n-type carrier in the region 1_26 (the region extending from the binding surface between the window layer 1_11 and the diffusive-concentration distribution-adjusting layer 1_9 into the window layer 1_11 by 0.1 μm and into the diffusive-concentration distribution-adjusting layer 1_9 by 0.1 μm), the measured maximum concentration of n-type carrier in the region 1_26a (the region extending from the binding surface between the window layer 1_11a and the diffusive-concentration distribution-adjusting layer 1_9a into the window layer 1_11a by 0.1 μm and into the diffusive-concentration distribution-adjusting layer 1_9a by 0.1 µm), and the measured maximum concentration of n-type carrier in the diffusive-concentration distribution-adjusting layer 1_9 or 1_9a, in Examples A8 to A11 and Comparative Examples 1 to 3. FIG. 12 also shows values of dark current (corresponding to the values for a light entrance diameter of 15 µmϕ) measured with a voltage of −5 V applied, in Examples A8 to A11 and Comparative Examples 1 to 3. The concentrations of n-type carrier shown in FIG. 12 are the values measured in the region that is constituted by the window layer 1_11 and the diffusive-concentration distribution-adjusting layer 1_9 excluding the impurity diffusive region 1_25, and the values measured in the region that is constituted by the window layer 1_11a and the diffusive-concentration distribution-adjusting layer 1_9a excluding the impurity diffusive region 1_25a.

FIG. 13 shows the concentrations of donor in Examples A8 to A11, and in Comparative Examples 1 to 3. FIG. 13 shows the measured maximum concentrations of donor in the window layer 1_11 or 1_11a, the measured maximum concentration of donor in the region 1_26 (the region extending from the binding surface between the window layer 1_11 and the diffusive-concentration distribution-adjusting layer 1_9 into the window layer 1_11 by 0.1 µm and into the diffusive-concentration distribution-adjusting layer 1_9 by 0.1 µm), the measured maximum concentration of donor in the region 1_26a (the region extending from the binding surface between the window layer 1_11a and the diffusive-concentration distribution-adjusting layer 1_9a into the window layer 1_11a by 0.1 µm and into the diffusive-concentration distribution-adjusting layer 1_9a by 0.1 µm), and the measured maximum concentration of donor in the diffusive-concentration distribution-adjusting layer 1_9 or 1_9a, in Examples A8 to A11 and Comparative Examples 1 to 3. FIG. 13 also shows values of dark current (corresponding to the values for a light entrance diameter of 15 µmϕ) measured with a voltage of −5 V applied, in Examples A8 to A11 and Comparative Examples 1 to 3.

In the photo detector 1_1 (Examples A8 to A11) having the structure described above, the maximum concentration of n-type carrier at the binding surface between the diffusive-concentration distribution-adjusting layer 1_9 and the window layer 1_11 (i.e., the concentration of n-type carrier in the region 1_26) is in a range of not less than $5 \times 10^{15}$ cm$^{-3}$ and not more than $1 \times 10^{19}$ cm$^{-3}$, and is higher than the concentration of n-type carrier in the region around the binding surface (i.e., around the region 1_26). The maximum concentration of donor at the binding surface between the diffusive-concentration distribution-adjusting layer 1_9 and the window layer 1_11 (i.e., the concentration of donor in the region 1_26) is in a range of not less than $5 \times 10^{15}$ cm$^{-3}$ and not more than $1 \times 10^{19}$ cm$^{-3}$, and is also higher than the concentration of donor in the region around the binding surface (i.e., around the region 1_26).

In contrast, in the photo detector 1_1a of Comparative Example 1, the maximum concentration of n-type carrier at the binding surface between the diffusive-concentration distribution-adjusting layer 1_9a and the window layer 1_11a (i.e., in the region 1_26a) is equal to or lower than the concentration of n-type carrier in the region around the binding surface (i.e., around the region 1_26a). The concentration of donor at the binding surface between the diffusive-concentration distribution-adjusting layer 1_9a and the window layer 1_11a (i.e., the concentration of donor in the region 1_26a) is also equal to or lower than the concentration of donor in the region around the binding surface (i.e., around the region 1_26a). This can generate, for example, carrier depletion or the defects 1_31 functioning as holes (p-type conductivity) at the binding surface between the diffusive-concentration distribution-adjusting layer 1_9a and the window layer 1_11a (in the region 1_26a), resulting in increased dark current.

In the photo detectors 1_1a of Comparative Examples 2 and 3, the maximum concentration of n-type carrier at the binding surface between the diffusive-concentration distribution-adjusting layer 1_9a and the window layer 1_11a (i.e., in the region 1_26a) is outside of a range of not less than $5 \times 10^{15}$ cm$^{-3}$ and not more than $1 \times 10^{19}$ cm$^{-3}$. The concentration of donor at the binding surface between the diffusive-concentration distribution-adjusting layer 1_9a and the window layer 1_11a (i.e., the concentration of donor in the region 1_26a) is also outside of a range of not less than $5 \times 10^{15}$ cm$^{-3}$ and not more than $1 \times 10^{19}$ cm$^{-3}$. This can generate, for example, carrier depletion or the defects 1_31 functioning as holes (p-type conductivity) at the binding surface between the diffusive-concentration distribution-adjusting layer 1_9a and the window layer 1_11a (in the region 1_26a), resulting in increased dark current.

Accordingly, in the adjacent photo detectors 1_1a, leakage of dark current can occur between the adjacent photo detectors 1_1a. In contrast, in the adjacent photo detectors 1_1, since the concentrations of n-type carrier and donor (Si) are relatively high (higher than $5 \times 10^{15}$ cm$^{-3}$) at the binding surface between the diffusive-concentration distribution-adjusting layer 1_9 and the window layer 1_11 (i.e., in the region 1_26), p-type conductivity can be prevented, resulting in reduced dark current, while p-type conductivity occurs in the photo detector 1_1a. Therefore, as shown in Part (b) of FIG. 10, in the photo detector 1_1 according to the second embodiment, a pnp junction is formed at the interface between two adjacent photo detectors 1, so that leak current generated in one of two adjacent photo detectors 1_1 (in the lateral direction) can be reduced.

The principles of the present invention have been described with reference to preferred embodiments and accompanying drawings. However, it will be appreciated by those skilled in the art that configurations and details of the embodiments can be modified without departing from the principles of the present invention. The present invention is not limited by the configurations disclosed in the embodiments. Hence, this application claims rights in the scope of the claims of the invention, and all variations and modifications derived from the scopes and spirits of the invention.

Industrial Applicability

The present invention provides a photo detector of group III-V semiconductor having an absorption layer and an n-type InP window layer, the absorption layer including a group III-V compound semiconductor layer doped with Sb as a group V constituent element, the photo detector generating reduced dark current in the cutoff wavelength of not less than 2 µm and not more than 3 µm.

REFERENCE SIGNS LIST

11: group III-V compound semiconductor photo detector;
13: semiconductor substrate;
13a: principal surface of the semiconductor substrate;
13b: rear surface of the semiconductor substrate;
13c, 13d: area of the principal surface of the semiconductor substrate;
15: semiconductor layer stack;
15a: principal surface of the semiconductor layer stack;
17: anode region;
21: absorption layer;

21c, 21d: portion of the absorption layer;
23: InP layer;
23c, 23d: portion of the InP layer;
25: InGaAs layer;
25c, 25d: portion of the InGaAs layer;
29a, 29b, 29c: p-n junction;
27: InGaAs layer;
27c, 27d: portion of the InGaAs layer;
33: anode electrode;
35: cathode electrode;
37: insulating layer;
1_1, 1_1a: photo detector;
1_11, 1_11a, 1_11b: window layer;
1_13: insulating layer;
1_15, 1_15a: p-type electrode;
1_17, 1_17a: n-type electrode;
1_19: second region;
1_21: first region;
1_25, 1_25a: impurity diffusive region;
1_26: region;
1_27: epitaxial wafer;
1_3, 1_3a, 1_3b: substrate
1_5, 1_5a, 1_5b: semiconductor layer;
1_7, 1_7a, 1_7b: absorption layer;
1_9, 1_9a, 1_9b: diffusive-concentration distribution-adjusting layer.

What is claimed is:

1. A photo detector comprising:
a substrate of group III-V semiconductor;
an absorption layer being provided on the substrate;
a diffusive-concentration distribution-adjusting layer of group III-V semiconductor being provided in contact with the absorption layer; and
a window layer of group III-V semiconductor being provided in contact with the diffusive-concentration distribution-adjusting layer and having a bandgap energy larger than the bandgap energy of the diffusive-concentration distribution-adjusting layer,
the absorption layer being disposed between the diffusive-concentration distribution-adjusting layer and the substrate,
the diffusive-concentration distribution-adjusting layer being disposed between the absorption layer and the window layer,
a semiconductor region being constituted by the window layer and the diffusive-concentration distribution-adjusting layer and having a first region and a second region, the first region and the second region being disposed adjacent to each other along a first binding surface between the semiconductor region and the absorption layer,
the first region containing a predetermined impurity element and being in contact with the second region,
the first region having p-type conductivity, and
a maximum value of a concentration of n-type carrier in a predetermined region being not less than $5 \times 10^{15}$ cm$^{-3}$ and not more than $1 \times 10^{19}$ cm$^{-3}$, the predetermined region extending from a second binding surface between the window layer and the diffusive-concentration distribution-adjusting layer into the window layer or the diffusive-concentration distribution-adjusting layer in the second region,
wherein the maximum value of the concentration of n-type carrier in the predetermined region is higher than a maximum value of a concentration of n-type carrier in an outside region in contact with the predetermined region, the outside region lying in the window layer or the diffusive-concentration distribution-adjusting layer.

2. The photo detector according to claim 1, wherein the thickness of the predetermined region is not less than 0.02 μm and not more than 0.2 μm.

3. The photo detector according to claim 1, wherein the impurity element is Zn.

4. The photo detector according to claim 1, wherein the diffusive-concentration distribution-adjusting layer is constituted by InGaAs.

5. The photo detector according to claim 1, wherein the window layer is constituted by InP.

6. The photo detector according to claim 1, wherein the absorption layer has a type-II multiple quantum well structure.

7. The photo detector according to claim 6, wherein the multiple quantum well structure is constituted by a pair of an $In_xGa_{1-x}As$ ($0.38 \le x \le 0.68$) layer and a $GaAs_{1-y}Sb_y$ ($0.36 \le y \le 0.62$) layer, or, a pair of a $Ga_{1-t}In_tN_uAs_{1-u}$ ($0.4 \le t \le 0.8$, $0 < u \le 0.2$) layer and a $GaAs_{1-v}Sb_v$ ($0.36 \le v \le 0.62$) layer.

* * * * *